(12) United States Patent
Posseme et al.

(10) Patent No.: US 9,780,000 B2
(45) Date of Patent: Oct. 3, 2017

(54) METHOD FOR FORMING SPACERS FOR A TRANSITOR GATE

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Maxime Garcia-Barros, Ivry sur Seine (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/361,260

(22) Filed: Nov. 25, 2016

(65) Prior Publication Data
US 2017/0154826 A1 Jun. 1, 2017

(30) Foreign Application Priority Data

Nov. 26, 2015 (FR) ..................................... 15 61442

(51) Int. Cl.
*H01L 21/311* (2006.01)
*H01L 21/8238* (2006.01)
(Continued)

(52) U.S. Cl.
CPC .. *H01L 21/823864* (2013.01); *H01L 21/0217* (2013.01); *H01L 21/0234* (2013.01); *H01L 21/02167* (2013.01); *H01L 21/31116* (2013.01); *H01L 29/401* (2013.01); *H01L 29/6653* (2013.01); *H01L 29/6656* (2013.01)

(58) Field of Classification Search
USPC ............................................. 216/46; 438/696
See application file for complete search history.

(56) References Cited

U.S. PATENT DOCUMENTS

2007/0232006 A1  10/2007  Hellmich et al.
2014/0187046 A1   7/2014  Posseme et al.
(Continued)

FOREIGN PATENT DOCUMENTS

EP        2 750 170 A1    7/2014

OTHER PUBLICATIONS

French Preliminary Search Report issued Aug. 12, 2016 in French Application 15 61442 filed on Nov. 26, 2015 (with English Translation of Categories of Cited Documents and Written Opinion).
(Continued)

*Primary Examiner* — Roberts Culbert
(74) *Attorney, Agent, or Firm* — Oblon, McClelland, Maier & Neustadt, L.L.P.

(57) ABSTRACT

A method for forming spacers of a gate of a field-effect transistor is provided, including at least one step of forming a protective layer covering the gate; depositing a layer comprising carbon, said layer being disposed distant from said transistor; modifying the protective layer to form a modified protective layer; forming a protective film on the layer comprising carbon; removing the protective film on surfaces of the protective film that are perpendicular to a main implantation direction; selectively removing the layer comprising carbon; and at least one step of selectively removing the modified protective layer.

20 Claims, 10 Drawing Sheets

(51) Int. Cl.
*H01L 29/66* (2006.01)
*H01L 29/40* (2006.01)
*H01L 21/02* (2006.01)

(56) References Cited

U.S. PATENT DOCUMENTS

2014/0273292 A1   9/2014   Posseme et al.
2016/0197160 A1*  7/2016   Posseme ................. H01L 21/84
                                                            438/696

OTHER PUBLICATIONS

Romuald Blanc et al. "Patterning of silicon nitride for CMOS gate spacer technology. I. Mechanisms involved in the silicon consumption in CH3F/02/He high density plasmas," Journal of Vacuum Science & Technology B: Microelectronics and Nanometer Structures, Jan. 1, 2013, pp. 5.

* cited by examiner optimisations:
-polySi = 10nm
-thickness of the hard mask = 30nm
-$\varepsilon_r$(cap.) = 3.9

METHOD FOR FORMING SPACERS FOR A TRANSITOR GATE

TECHNICAL FIELD OF THE INVENTION

The present invention relates in general to field-effect transistors (FET) used by the microelectronics industry, and more specifically to manufacturing the gate spacers of metal-oxide-semiconductor transistors (MOSFET) used for the most part for producing all sorts of integrated circuits.

PRIOR ART

The endless race to reduce size that characterises the entire microelectronics industry was made possible by the contribution of key innovations over decades of development since the first integrated circuits were industrially produced in the nineteen-sixties. A very important innovation that dates to the nineteen-seventies and is still in use today is the production of MOSFET transistors using a technique in which the source and drain electrodes are self-aligned with the gate electrodes and do not therefore require a photolithography operation in order to be defined. Combined with the use of gates made of polycrystalline silicon, it is the gates themselves, which are created first, that are used as a mask during the doping of the source and drain regions of the transistors.

FIG. 1 is a cross-sectional view of an example of this type of transistor 100 being manufactured. The source and drain regions 110 can be seen in this figure and are generally designated source/drain regions since said regions are very generally perfectly symmetrical and can act as both according to the electric polarisation that is applied to the transistor. The gate conventionally consists of a stack of layers 120, a large portion of which always consists of polycrystalline silicon 123. The formation of the source and drain regions is typically carried out via ion implantation 105 of dopants in the regions 110, the gate 120 acting as a mask as mentioned above, thus preventing the doping of the region of the MOSFET transistor in which, according to the voltages applied to the gate, the conducting channel 130 between source and drain can be formed.

The basic technique well known to a person skilled in the art, very briefly described above, and numerous variations have been continually perfected in order to improve the electric performance of the transistors while providing for the successive reductions in the size of the transistors, required by an ever-growing integration of more and more components into an integrated circuit.

A technique currently widely used involves manufacturing the integrated circuits from elaborate silicon-on-insulator substrates 140, designated by the acronym thereof, SOI. The elaborate SOI substrate is characterised by the presence of a fine surface layer of monocrystalline silicon 146 resting on a continuous layer of silicon oxide 144, called buried oxide or BOX, acronym for "buried oxide layer." The solidity and the mechanical rigidity of the assembly are provided by the layer 142 that forms the body of the SOI substrate, often described by the English term "bulk" in order to indicate that the starting substrate is very generally made of bulk silicon. This structure provides numerous advantages for the production of MOSFET transistors. Namely, this structure allows a drastic reduction in the parasitic capacitances because of the presence of the continuous insulating layer 144. With regard to the invention, the only thing to note is that the surface layer of monocrystalline silicon 146 can be precisely controlled in terms of thickness and doping. In particular, it is advantageous for the performance of the transistors that the channel 130 be able to be completely depleted of carriers, that is to say, "fully depleted" (FD), the English term that is generally used to designate this state. This is achieved by producing the transistors from SOI substrates, the surface layer 146 of which is very thin, which, by the way, has disadvantages, as will be understood from the description of the invention. This type of transistor is thus designated by the acronym FDSOI.

An improvement of the basic self-alignment technique that was universally adopted is the formation of spacers 150 on the sides of the gate. The spacers 150, typically made of silicon nitride (SiN), in particular allow a technique called "Raised Source and Drain" to be implemented. In order to be able to maintain low electric resistances of access to the source and drain electrodes despite the reduction in the size of the transistors, the cross-section of said transistors had to be increased. This is obtained by selective epitaxy of the source/drain regions 110. During this operation, the initial layer of monocrystalline silicon 146 is grown locally 112. The gate regions thus have to be protected in order to prevent the growth from also occurring on the polycrystalline silicon 123 of the gate. The role of the spacers, inter alia, is to carry out this function. The spacers also have the function of preserving the gate during the siliconisation of the contacts (not shown), which is subsequently carried out with the same goal in order to reduce the series resistance of access to the electrodes of the transistor.

The formation of the spacers 150 has become a crucial step in the formation of the transistors, which now reach sizes that are routinely measured in nanometers (nm=$10^{-9}$ meters) and which globally have a decananometric size. The spacers are created without the use of a photolithography operation. The spacers are self-aligned on the gate 120 using the deposition of a uniform layer of silicon nitride 152 (SiN) that then undergoes very highly anisotropic etching. This etching of the SiN preferably attacks the horizontal surfaces, that is to say, all the surfaces that are parallel to the plane of the SOI substrate. This etching only leaves in place, imperfectly, the vertical portions of the layer 152, the portions substantially perpendicular to the plane of the substrate, in order to obtain, in practice, the patterns 150, the ideal shape of which would obviously be rectangular.

With the known solutions, the reduction in the size of the transistors makes obtaining spacers that fully act as insulators and do not induce defects in the manufacturing of transistors from SOI substrates very delicate. Indeed, in the context of the present invention, and as will be detailed below, it was noted that several types of defects such as the defects mentioned below appear during the etching of the spacers using one or the other of the known methods of anisotropic etching.

FIGS. 2a, 2b and 2c each illustrate a type of defect observed. In particular, a type of etching called "dry" etching is used, implemented using a method that is most often designated by the acronym thereof, RIE, from "reactive-ion etching". This is an etching method in which a plasma that reacts physically and chemically with the surface of the wafer to be etched is formed in a confined chamber. In the case of the etching of a layer of silicon nitride, which is, as seen above, the preferred material for creating the spacers, the reactive gas is typically methyl fluoride (CH3F) that is reacted with the material to be etched while also introducing dioxygen (O2). An etching plasma based on the chemistry of the fluorine and often designated by the components of said plasma —CH3F/O2/He— is thus formed. In this plasma, the fluorine component is used to etch the silicon nitride while the oxygen allows the polymerisation of the methyl fluoride to be limited and is also used to oxidise the silicon when this material is reached during etching. The layer of oxide formed on the silicon allows the etching of the silicon to be slowed down, but also means that said silicon is transformed into an oxide on the surface and therefore that silicon is consumed on the surface. The helium is used as a diluent for the oxygen.

The advantage of this type of etching is that said etching is rather anisotropic and allows the profile of the spacers 150 to be sufficiently controlled even if, in practice, the ideal rectangular shape cannot be obtained. The disadvantage of this type of etching is that the selectivity of attack of the underlying silicon is limited. The selectivity, that is to say, the ratio between the etching rates of the silicon nitride and the silicon, is approximately 10, and can reach 15 maximum according to the conditions in which the plasma is formed (the nitride is etched 10 to 15 times faster than the silicon).

Etching called "wet" etching is also used, using hydrofluoric acid (HF) or phosphoric acid (H3PO4), the latter in particular for SiN, said acids having much better selectivity with respect to silicon or to the oxide thereof (SiO2), respectively, but not allowing the profile of the spacers to be controlled since the etching is essentially isotropic in this case. It should be noted here that this type of etching is also called "wet cleaning".

It should be noted here that there are numerous publications on the subject of the etching of the silicon nitride and/or the gate spacers in general. Reference can be made, for example, to the following American patents or patent applications: 2003/0207585; U.S. Pat. Nos. 4,529,476; 5,786,276; and 7,288,482.

FIG. 2a illustrates a first problem related to the insufficient attack selectivity that exists during CH3F/O2/He dry etching between the silicon nitride and the silicon of the surface layer 146. The result is that a significant fraction of the thin surface layer of monocrystalline silicon 146 of the SOI substrate can therefore be partly consumed 147 during the anisotropic etching of the nitride.

As previously mentioned, the surface layer 146 is chosen to have a small thickness in order to improve the electric characteristics of the transistors. This thickness is typically less than 10 nm. The remaining thickness 145 can be very small. In these conditions, the ion implantation 105 that follows, for forming the source and drain regions 110, can be very damaging to the remaining monocrystalline silicon. The implantation energy of the dopants can be sufficient to cause total amorphisation 149 of the monocrystalline silicon, which in particular compromises the subsequent step 112 of epitaxial growth intended to form the raised source/drain. As previously mentioned, this latter operation is necessary because of the reduction in the size of the transistors in order to be able to maintain the resistances of access to the source and drain electrodes at values sufficiently low to not impact the electric operation of the transistors. Growth starting from a layer of silicon partly or completely made amorphous creates numerous defects in the layer formed via epitaxy.

FIG. 2b illustrates another problem, where there is not significant consumption of the silicon of the surface layer 146, but there is the formation of "feet" 154 at the bottom of the patterns of silicon nitride remaining on the sides of the gate after etching. The result is that the transition 114 to the junctions with the region of the channel 130 that are formed after doping via ion implantation 105 of the source and drain regions 110 is much less abrupt than when the spacers do not have feet, as shown in the previous drawings. The presence of feet 154 affects the electric characteristics of the transistors. It should be noted here that the formation or non-formation of feet at the bottom of the spacers and the consumption or non-consumption of silicon of the surface layer of silicon 146 of the SOI substrate, described in the previous figure, are antagonistic adjustment parameters of the etching that require a compromise to be found in which, ideally, no feet are formed and the surface layer of silicon is not significantly attacked.

FIG. 2c illustrates a third problem that occurs when the etching produces too much erosion of the spacers in the upper portions of the gates and exposes the polycrystalline silicon 123 in these regions 156. The result is that the subsequent epitaxial growth 112 for forming the raised source/drain also takes place at these locations, and siliconisation of parasite contacts takes place as well, which may cause short circuits between electrodes. Indeed, the etching of the spacers requires the etching time to be adjusted in order to etch, for example, 150% of the thickness of the nitride deposited. That is to say, overetching of 50% takes place in this example in order to take into account the non-uniformity of the deposition, or of the etching operation itself, on a wafer. Thus, in certain portions of the wafer, there may be too much overetching, which exposes the gate regions 156. This type of defect is also called "facetting".

Another type of problem that occurs during operations of etching the spacers is related to the fact that P-channel and N-channel transistors must be made like on the same integrated circuit. As illustrated in FIGS. 2d and 2e, all the N-type transistors must thus be protected with photosensitive resin 270 while the P-type transistors are made, and vice versa. This adds an additional constraint to the above etching steps, which must leave in place a sufficient thickness 280 of resin for the subsequent manufacturing operations that are specific to a type of transistor.

The goal of the present invention is to propose a method, for forming spacers that fully act as insulators, that would eliminate or limit at least some of the defects in the production of transistors, such as the consumption or alteration of the semiconductor material (i.e. Si, SiGe) of the active layer, the formation of "feet" at the bottom of the patterns on the sides of the gate of a transistor, the consumption of a protective layer containing carbon, etc.

The other goals, features and advantages of the present invention will be clear upon examination of the following description and the accompanying drawings. It is understood that other advantages may be incorporated.

SUMMARY OF THE INVENTION

To reach this goal, an aspect of the present invention relates to a method for forming the spacers of a gate of a field-effect transistor, the gate being located above an active layer made of a semiconductor material, comprising a step of forming a protective layer covering the gate of said transistor. This the protective layer is preferably a layer containing nitride (N) and/or containing silicon (Si) and/or containing carbon (C) and having a dielectric constant less than or equal to 8;

a step of depositing a layer comprising carbon. This layer comprising carbon being distant from said transistor. According to a non-limiting embodiment, this layer forms a masking block that encapsulates another structure such as another transistor;

at least one step of modifying the protective layer, carried out after the step of forming the protective layer, by placing the protective layer in the presence of a plasma comprising ions heavier than hydrogen and CxHy, where x is the proportion of carbon and y is the proportion of hydrogen, in order to form a modified protective layer and form a carbon film.

The modification step is carried out in such a way that the plasma causes anisotropic bombardment of ions made from hydrogen coming from the CxHy in a main implantation direction parallel to sides of the gate, in such a way as to form a modified protective layer by modifying portions of the protective layer located at the top of the gate and on either side of the gate and in such a way as to preserve portions of the protective layer covering the sides of the gate that are non-modified or at least non-modified over the entire thickness thereof.

The ions made from hydrogen are preferably taken from: $H$, $H^+$, $H_2^+$, $H_3^+$.

A carbon film is a film comprising chemical species containing carbon. According to a non-limiting embodiment, the carbon film is made of carbon. Advantageously, the carbon film can contribute to the protection of the sides of the gate during the bombardment by preventing hydrogen or heavy ions from modifying the protective layer or modifying the protective layer over the entire thickness of said layer.

Very advantageously, the carbon film contributes to the protection of the non-modified protective layer on the sides during the subsequent etching of the modified protective layer with HF, for example.

The modification step is carried out in such a way as to form a carbon film in particular on surfaces parallel to the main implantation direction, also called direction of the bombardment.

- at least one step of forming a protective film on at least the layer comprising carbon, as well as on the modified protective layer and on the carbon film covering the gate. Said film is preferably, but optionally, conformal.
- a step of removing the protective film, carried out in such a way as to:
  - remove the protective film on the surfaces of the protective film that are perpendicular to the main implantation direction, and thus in particular on the top of the gate and on at least one top of the layer comprising carbon;
  - preserve the protective film on the surfaces of the protective film that are parallel to the main implantation direction, and thus in particular on the sides of the gate;
- a step of selectively removing the layer comprising carbon from the modified protective layer and the protective film. Thus, when the layer comprising carbon is removed, the protective film protects the sides of the gate. This step of removing the layer comprising carbon does not therefore damage the carbon film and the non-modified protective layer that are present on the sides of the gate.
- at least one step of removing the modified protective layer via selective etching of the modified protective layer with respect to said carbon film and with respect to the non-modified portions of the protective layer.

Thus, the carbon film is protected by the protective film during the step of removing the layer comprising carbon forming, for example, a block of resin covering a structure other than said transistor. Thus, the carbon film is integrated during the step of removing the modified protective layer. During this step, said film can therefore effectively act as a protective layer in order to protect the non-modified portions of the protective layer intended to form spacers.

Thus, the invention prevents a portion of the protective film from being consumed during the removal of at least a portion of the layer comprising carbon, which would result in a loss of size control during the removal of the modified protective layer.

Consequently, the invention proposes an effective solution for solving the problems related to improving the size control of the spacers. The invention is even more advantageous in a context in which a step of removing the layer comprising carbon (for example a layer of resin) must be carried out before the step of forming the spacers by removal of the modified protective layer.

The present invention thus proposes a method, for forming spacers that fully act as insulators, that would eliminate or limit at least some of the defects in the production of transistors, such as the consumption or alteration of the semiconductor material (i.e. Si, SiGe) of the active layer, the formation of "feet" at the bottom of the patterns on the sides of the gate of a transistor, the consumption of a protective layer containing carbon, etc.

Particularly advantageously, it has been noted that the bombardment of ions heavier than hydrogen, such as He, allows the chemical species of the plasma containing carbon from CxHy to form a protective film of carbon (carbon film) in particular on surfaces parallel to the direction of the bombardment while also preventing these chemical species containing carbon from forming a carbon film on the surfaces of the protective layer that are perpendicular to the direction of the bombardment.

Indeed, the bombardment of ions heavier than hydrogen destroys the carbon film that would tend to be deposited on the surfaces perpendicular to the direction of the bombardment.

During the step of removing the modified protective layer, this etching etches the surfaces of the modified protective layer that are not covered with the carbon film. Thus, it is possible to protect a structure on which the carbon film is formed. Moreover, it has been noted that the ion bombardment does not prevent the formation of this carbon film when a layer comprising carbon is present along with the plasma. This carbon film thus acts as a protective film that prevents the modification of the carbon layer coated by the film. Moreover, since the etching of the step of removing the modified protective layer is selective for the modified protective layer with respect to carbon, the carbon film formed on the carbon layer protects said layer during the step of removing the modified protective layer.

Particularly advantageously, the modification of the protective layer via bombardment of hydrogen ions (H) leads to the implantation of said ions made from hydrogen in the layers targeted. This modification by implantation of ions allows the selectivity of the etching of this layer with respect to the semiconductor material, typically silicon, to be improved considerably. This implantation also means that the modified protective layer thickness is etched faster than the non-modified protective layer.

The etching of the step of removing the modified protective layer thus preferably consumes the modified protective layer with respect to the layer of semiconductor material and the non-modified portions of the protective layer. Thus, the risk of excessive consumption of the surface layer of semiconductor material is reduced or even eliminated.

Preferably, the modification of the protective layer preserves a partial or complete thickness of the non-modified protective layer on the sides of the gate. This thickness is at least partially preserved during the selective etching. This thickness thus defines gate spacers.

Moreover, the carbon film contributes to the protection of the non-modified protective layer on the sides during the etching of the modified protective layer.

The invention thus allows spacers to be obtained while reducing or even eliminating the problems of the solutions known and previously mentioned.

Furthermore, the invention provides advantages related to the implantation via plasma.

The implantation carried out using a plasma comprising said ions made from hydrogen has the advantage of allowing continuous implantation in a volume extending from the surface of the implanted layer.

Implantation via plasma allows both physical action (ion bombardment) and chemical action (deposition of the carbon film).

Moreover, the use of a plasma allows implantation at smaller depths than the minimum depths that can be obtained with implanters. Thus, implantation via plasma allows small thicknesses that can then be removed via selective etching to be implanted effectively and in a relatively homogeneous manner, or at least continuously. This continuity of implantation from the implanted face allows the homogeneity of the modification over the depth to be improved, which leads to an etching rate of the implanted layer that is constant over time. Moreover, the increase in the selectivity provided by the implantation with respect to the other layers is effective from the beginning of the etching of the implanted layer. Implantation via plasma thus allows significantly improved control of the etching precision.

Plasma implantation typically allows thicknesses extending from the surface of the implanted layer over a depth from 0 nm to 100 nm to be implanted and then removed. Conventional implanters allow implantation in a volume between 30 nm and several hundred nanometers. However, conventional implanters do not allow the species to be implanted between the surface of the layer to be implanted and a depth of 30 nm. In the context of the development of the present invention, it was observed that the implanters do not therefore allow a sufficiently constant etching rate of the modified protective layer to be obtained starting from the surface of said layer, thus leading to less etching precision in comparison to that which is allowed by the invention.

The use of a plasma to modify the layer to be removed is therefore particularly advantageous in the context of the invention that aims to remove a small thickness of the protective layer, typically between 1 and 10 nm and more generally between 1 and 30 nm.

The modification step carried out using a plasma modifies the protective layer continuously from the surface of the protective layer over a thickness between 1 nm and 30 nm and preferably between 1 nm and 10 nm.

Also advantageously, the modification of the protective layer via implantation of ions made from hydrogen also allows the selectivity of this modified protective layer with respect to the oxide of the semiconductor material to be improved.

Thus, during the modification step, the conditions of the plasma, in particular the concentration of CxHy, the energy of the ions and the main implantation direction, are chosen in such a way that:

the plasma creates an anisotropic bombardment of ions made from hydrogen (H) coming from the CxHy, in a favoured direction parallel to sides of the gate, in such a way as to modify portions of the protective layer outside of the sides of the gate while leaving portions of the protective layer covering the sides of the gate non-modified or at least non-modified over the entire thickness of said portions, chemical species of the plasma containing carbon coming from the CxHy form a carbon film, in particular on surfaces parallel to the direction of the bombardment;

the plasma creates a bombardment of the ions heavier than hydrogen that prevents the chemical species containing carbon coming from the CxHy from forming a carbon film, in particular on the surfaces of the protective layer that are perpendicular to the direction of the bombardment.

The invention provides another significant advantage in that the invention is adapted to the use of materials having low permittivity.

In the microelectronics industry, the ever-greater reduction of the dimensions of MOSFET transistors creates a problem of parasitic capacitance related to the spacers. More precisely, this problem relates to the relative increase in the values of parasitic capacitances that directly affect the electric performance of the transistors, in particular those between the conducting channel and the source and drain regions that are directly dependent on the thickness of the spacers and on the relative permittivity, called "k", of the material forming said spacers, which is conventionally, as shown above, silicon nitride. Indeed, when the size of the transistors is reduced, the value of these parasitic capacitances is not reduced by the same factor as the factor applied to the repetition rate or "pitch" of the gates of the transistors that conditions the increase in integration density obtained.

The invention is perfectly adapted to the use of materials having a permittivity k lower than the permittivity of the silicon nitride, the k of which is close to 7.5).

FIG. 3 illustrates the dependency of the total capacitance between the gate and the source and drain contacts on the permittivity of the material forming the spacers. To create the spacers, materials having a low permittivity, called materials having a "low k", can thus be chosen, such as: silicon oxycarbide (SiCO), silicon carbide (SiC), silicon carbonitride (SiCN), and other compounds such as SiOCN and SiCBN in a porous or non-porous form.

Such materials in thin layers react to anisotropic dry etching in a different manner than the silicon nitride (SiN) conventionally used. This etching is conventionally carried out in a $CH_3F/He/O_2$ plasma that can modify the dielectric properties of the films made from the materials mentioned above and in particular has the effect of increasing the relative permittivity of said materials which goes against the desired goal. At worst, the modifications made to the film by the plasma etching can make said film become very sensitive to the conventional cleaning operations that follow, for example such as the cleaning operation carried out before epitaxy of the source and drain regions in a solution containing hydrofluoric acid (HF), and even make said film completely disappear.

Optional features that can optionally be used in combination with or alternatively to the features above are listed below:

The bombardment of ions heavier than hydrogen (designated hereinafter as "heavy ions"), and in particular the energy, the direction and the fluence of said bombardment, are provided in such a way that the carbon film is formed on the surfaces parallel to the implantation direction and in such a way that the carbon film is not formed on the surfaces of the protective layer that are perpendicular to the implantation direction. More precisely, the ion bombardment consumes, in a highly anisotropic manner, the chemical species containing carbon that are deposited on the bottom of the structures. The bombardment in a direction perpendicular to the implantation direction (that is to say, at the sides) is very weak. The energy of the ions is not therefore sufficient to prevent the formation of this carbon film.

Said layer comprising carbon is distant and distinct from the transistor for which the spacers are created. This layer comprising carbon forms, for example, a block for masking a structure previously created. The invention is thus particularly advantageous for creating different structures on the same substrate, for example an NMOS transistor adjacent to a PMOS transistor.

Preferably, the layer comprising carbon is a layer of photosensitive of heat-sensitive resin. An NMOS transistor, for example, can be coated with a resin containing carbon while a PMOS transistor is not coated with the resin. The resin protects the NMOS transistor during the step of modifying and etching the protective layer of the PMOS transistor.

In another embodiment, this layer comprising carbon is one of: a layer of polymer, amorphous carbon, an anti-reflective layer usually designated by the acronym thereof, BARC, for bottom anti-reflective coating, a layer containing carbon deposited via spin coating (spin-on carbon). Said layer comprising carbon can also be one of these layers associated with a layer of resin.

This layer can also be resin alone, said resin comprising carbon. In the context of the present invention, a resin is a material that can be shaped via exposure to a beam of electrons, of photons or of X-rays, or mechanically.

In another embodiment, this layer comprising carbon is a hard mask preferably formed by carbon.

In an advantageous embodiment, said layer comprising carbon is configured to cover a structure distinct from said transistor, said structure and the transistor being on the same substrate.

Preferably, said structure is located above said active layer made of a semiconductor material.

Preferably, said transistor is an NMOS transistor and said structure is a PMOS transistor. In another preferred embodiment, said transistor is a PMOS transistor and said structure is an NMOS transistor.

Preferably, during the modification step carried out by placing the protective layer in the presence of the plasma comprising CxHy, the carbon film covers the walls of the layer comprising carbon, the thickness e2 of the carbon film covering the walls of the layer comprising carbon being greater than the thickness e1 of the carbon film on the sides of the gate.

Thus, the carbon film having a thickness e2 resists the bombardment of the ions, which allows the layer comprising carbon to be protected during the modification step.

BRIEF DESCRIPTION OF THE DRAWINGS

The goals and objects, as well as the features and advantages, of the invention will be better understood from the detailed description of an embodiment of said invention that is illustrated by the following accompanying drawings, in which.

Figure 1:
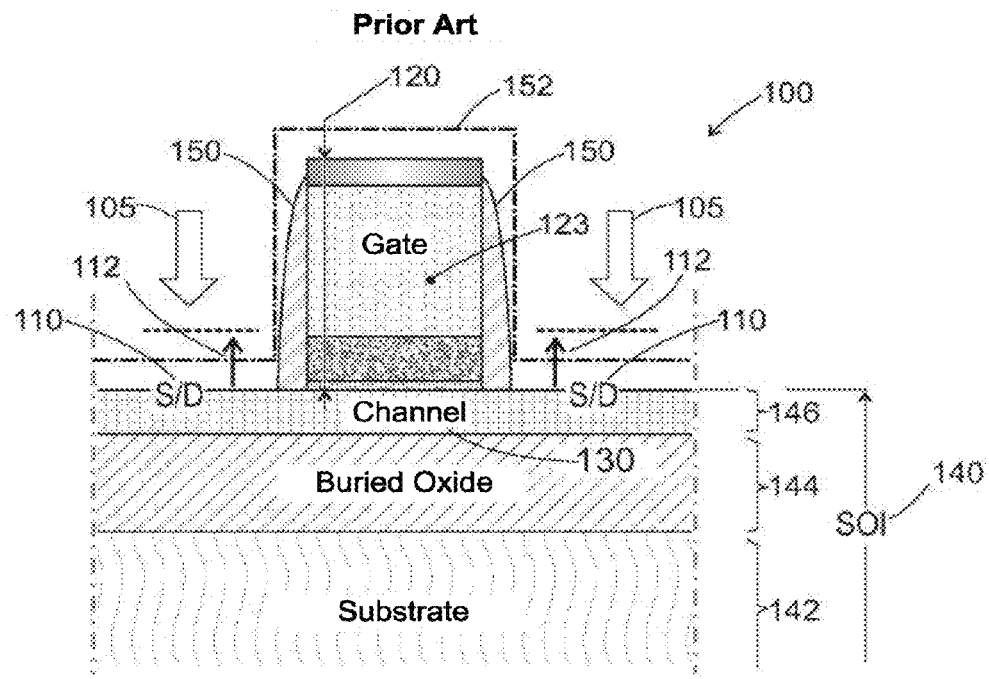
FIG. 1 illustrates a cross-sectional view of an example of an FDSOI MOSFET transistor being manufactured.

The accompanying drawings are given as examples and are not limiting to the invention. These drawings are schematic representations and are not necessarily on the scale of practical use. In particular, the relative thicknesses of the layers and of the substrates are not representative of reality.

DETAILED DESCRIPTION OF THE INVENTION

It is specified that in the context of the present invention, the term "on", "is on top of", "covers" or "underlying" or the equivalents thereto do not necessarily mean "in contact with." Thus, for example, the deposition of a first layer on a second layer does not necessarily mean that the two layers are directly in contact with each other, but this means that the first layer at least partly covers the second layer while being either directly in contact with said layer or separated from said layer by another layer or another element.

In the following description, the thicknesses are generally measured in directions perpendicular to the plane of the lower face of the layer to be etched or the plane of a substrate on which the lower layer is positioned. Thus, the thicknesses are generally taken in a vertical direction on the drawings shown. However, the thickness of a layer covering a side of a pattern is taken in a direction perpendicular to said side.

Conventionally, the dielectric constant of a layer can be measured, for example, according to the method called mercury drop method Before starting a detailed review of embodiments of the invention, optional features that can optionally be used in combination or alternatively are listed below:

the layer comprising carbon is configured to cover a structure distinct from said transistor.

said transistor is an NMOS transistor and said structure is a PMOS transistor. Alternatively, said transistor is a PMOS transistor and said structure is an NMOS transistor.

the step of modifying the protective layer and the step of forming the protective film are carried out in the same plasma reactor.

the step of removing the protective film comprises etching carried out in such a way as to remove the protective film on the top of the gate and on at least one top of the layer comprising carbon and in such a way as to preserve the protective film on the sides of the gate.

the step of removing the protective film comprises plasma etching carried out in the same reactor as said modification step.

the protective film located on the sides of the gate is removed during the step of removing the modified protective layer.

the protective film is taken from: an oxide and a nitride.

the protective layer has a dielectric constant lower than 6 and preferably lower than 4 and preferably lower than 3.1 and preferably lower than or equal to 2.

the protective layer is a layer containing nitride (N) and preferably a layer of silicon nitride (SiN).

the protective layer is a layer containing silicon (Si).

the protective layer is a layer containing carbon (C).

the material of the protective layer is taken from SiCO, SiC, SiCN, SiOCN, SiCBN, SiOCH, CBN, BN, and SiO2.

the protective layer is a porous layer.

the protective layer is a non-porous layer.

the step of forming the protective layer comprises a step of deposition of the protective layer during which a step of reducing the dielectric constant of the protective layer is carried out.

the dielectric constant of the protective layer involves the introduction of porosity into the protective layer.

the step of forming the protective layer comprises the introduction of precursors into the protective layer being deposited.

the step of forming the protective layer comprises a step of deposition of the protective layer during which a step of reducing the dielectric constant of the protective layer is carried out. The step of forming the protective layer comprises the introduction of precursors into the protective layer being deposited. The protective layer is a layer containing silicon nitride. The precursors are chosen in such a way as to form bonds less polar than the silicon nitride, such as Si—F, SiOF, Si—O, C—C, C—H and Si—CH3.

during said step of modifying the protective layer, the concentration of CxHy in the plasma is between 2% and 50% and preferably between 4% and 40%.

during said step of modifying the protective layer, the concentration of ions heavier than hydrogen in the plasma is between 50% and 98%.

the CxHy is CH4.

the ions heavier than hydrogen are taken from argon (Ar), helium (He), nitrogen (N2), xenon (Xe) and oxygen (O2).

the modification step is carried out in such a way that the plasma generates a bombardment of ions heavier than hydrogen in an anisotropic manner in the main implantation direction parallel to the sides of the gate in such a way as to prevent said chemical species of the plasma containing carbon coming from the CxHy from forming a carbon film on the surfaces perpendicular to the sides of the gate.

the modification step is carried out in such a way that the ions of the plasma heavier than hydrogen dissociate the molecule of CxHy in order to allow the hydrogen ions (H) coming from the CxHy to form ions made from hydrogen and be implanted in said portions of the protective layer.

the modification step is carried out in such a way as to modify only an upper portion of the thickness of the protective layer on the sides of the gate while preserving a non-modified thickness of the protective layer on the sides of the gate.

the step of removing the modified protective layer is carried out via etching selectively with respect to the active layer.

during the modification step, the conditions of the plasma, in particular the concentration of CxHy, the energy of the ions and the main implantation direction, are chosen in such a way that, on the surfaces perpendicular to the main implantation direction, the entire thickness of the protective layer is modified by the implantation of the ions made from hydrogen. The step of removing the modified protective layer is carried out in such a way as to remove all of the modified protective layer, thus exposing the active layer at the surfaces perpendicular to the main implantation direction.

the step of removing the modified protective layer is carried out via wet etching.

the semiconductor material is silicon and the step of removing the modified protective layer is carried out via wet etching selectively with respect to said semiconductor material of the active layer and/or with respect to silicon oxide (SiO2) forming the protective film of the gate.

the etching selective with respect to silicon is obtained using a solution containing hydrofluoric acid (HF).

the modified protective layer contains nitride and the etching selective with respect to silicon is obtained using a solution containing H3PO4.

the removal step is carried out via selective dry etching of said modified protective layer with respect to said carbon film, with respect to the non-modified portions of the protective layer and with respect to said semiconductor material.

the dry etching is carried out in a plasma formed in a confined chamber from nitrogen trifluoride (NF3) and ammonia (NH3).

the dry etching comprises: an etching step involving the formation of solid salts; a step of sublimation of the solid species.

the method comprises a plurality of sequences each comprising a modification step and a step of removal of the modified protective layer. During at least one of the modification steps, only a portion of the thickness of the protective layer is modified.

the sequences are repeated of the modified protective layer until the modified protective layer disappears from all the surfaces parallel to the plane of a substrate on which the gate rests.

the step of modifying the modified protective layer is a single step carried out in such a way as to modify the protective layer over the entire thickness thereof on all the surfaces parallel to the plane of a substrate on which the gate rests and not modify the protective layer over the entire thickness thereof on the surfaces perpendicular to this plane.

the modification step is preceded by an anisotropic etching step that is carried out in a CH3F/O2/He plasma.

the semiconductor material is taken from: silicon (Si), germanium (Ge), silicon-germanium (SiGe).

the modification step carried out using a plasma modifies the protective layer continuously from the surface of the protective layer and over a thickness between 1 nm and 30 nm and preferably between 1 nm and 10 nm.

Detailed embodiments of the invention will now be described with reference to the drawings.

Figure 6:
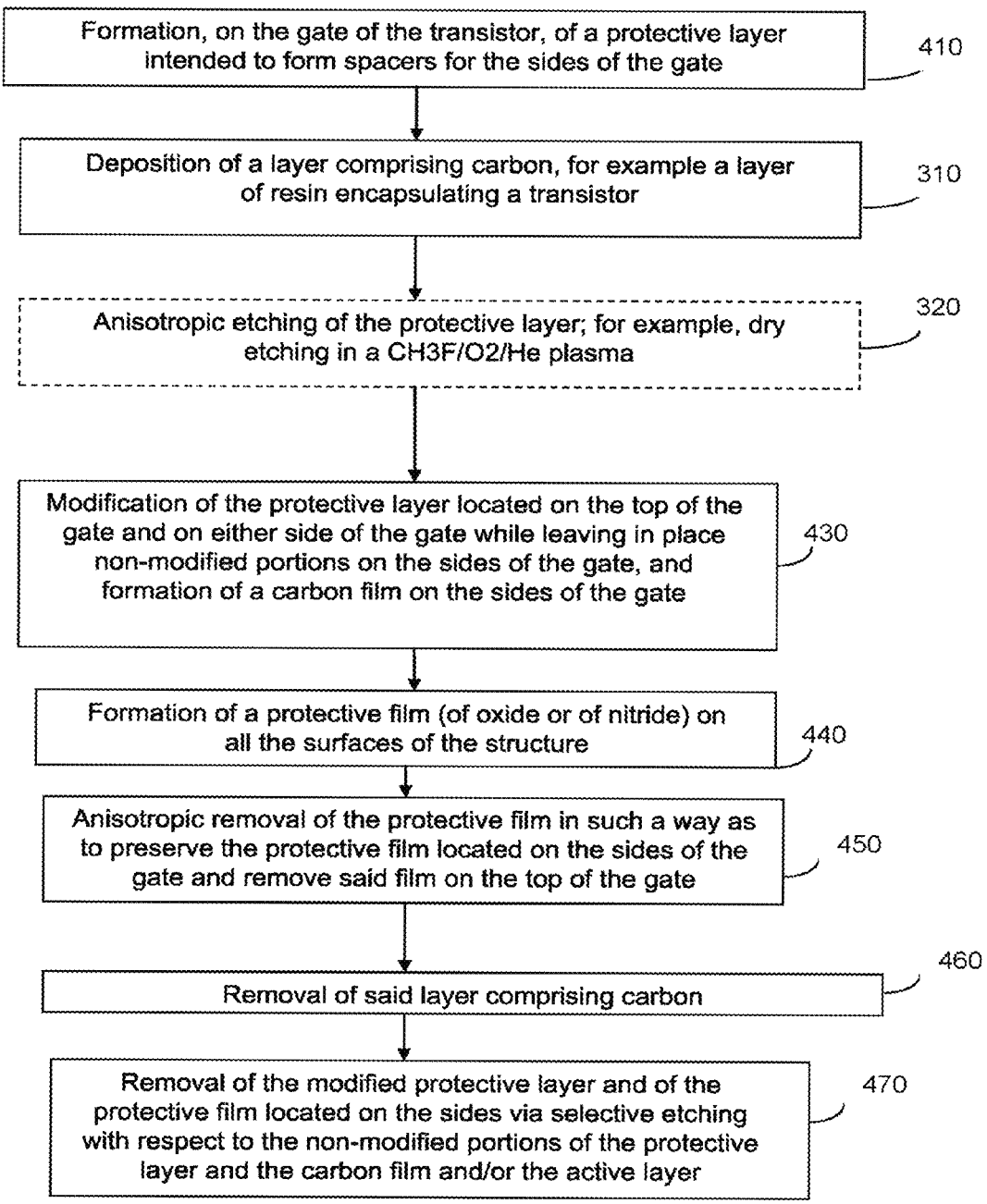
FIG. 6 summarises the main steps of an example of a method for forming the spacers of a transistor according to the invention.

The main steps 410 to 470 of a detailed example of a method for forming the spacers of a transistor according to the invention are illustrated in FIGS. 4a to 4g. FIG. 6 summarises these steps.

Figure 4A:
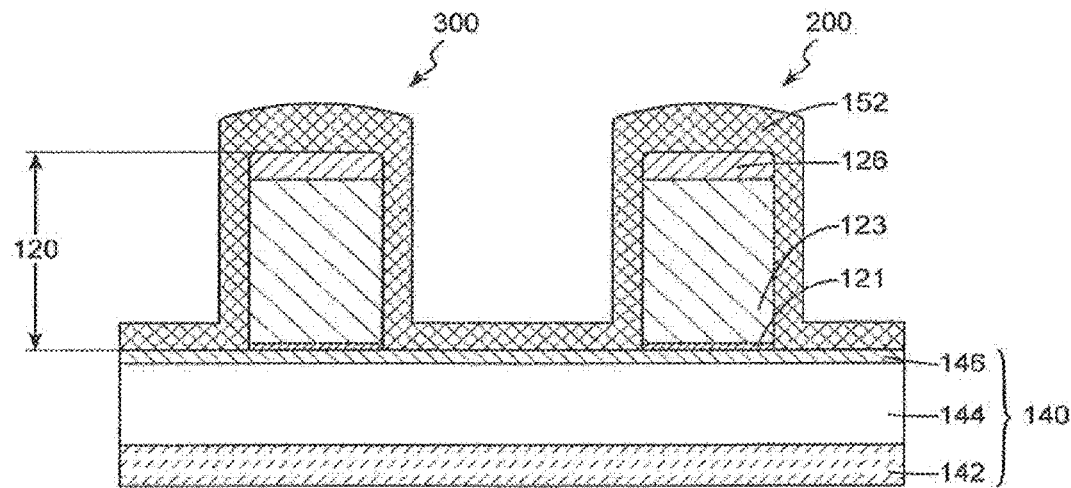
FIGS. 4a to 4g illustrate the structures of a transistor obtained after some of the steps of the method according to an embodiment of the invention.

FIG. 4a illustrates a structure obtained after the step 410 of forming a protective layer 152 covering transistors 200, 300 formed on an SOI substrate 140 comprise an active layer 146 on top of which there is a gate 120 of the transistor 200.

The formation of the transistor 200 or 300 involves in particular the creation of an elaborate SOI substrate 140 from a substrate 142, often designated bulk substrate, an initial insulating layer 144 and the active layer 146, this latter layer being intended to later form a conducting channel of the transistor.

Alternatively, the semiconductor material is taken from: germanium (Ge), silicon-germanium (SiGe).

In addition to a layer of polycrystalline silicon 123, a stack of the layers forming the gate 120 first contains a thin insulating layer of gate oxide 121 through which an electric field will be able to develop in order to create an underlying conducting channel between source and drain when sufficient electric voltage is applied to the gate 120.

In the most recent MOSFET transistors, a technology qualified by the term "high-k/metal gate" is implemented, that is to say, the dielectric layer 121 is made from an insulating material having high permittivity (high-k) coated with a metal layer (metal gate; not shown in the drawings) of the gate 120. At this stage, the stack of layers of the gate 120 also comprises a protective hard mask 126 that will later be removed in order to allow contact to be re-established on this electrode. This hard mask 126, which remains in place after etching of the gate, is typically made from silicon oxide (SiO2). The role of this mask is to protect the top of the gate 120 from any damage during the execution of the following steps, in particular the steps of etching the spacers.

Preferably, the dielectric layer 121 is positioned in contact with the active layer 146 forming the conducting channel. Preferably, the metal layer is positioned in contact with the dielectric layer 121. Preferably, the layer of polycrystalline silicon 123 is positioned directly in contact with the gate oxide formed by the dielectric layer 121 if the metal layer is absent or positioned directly in contact with the metal layer.

Preferably, a structure 300 distinct from the transistor 200 is formed, before the step 410 of forming the protective layer 152, on the substrate 140 on which the gate 120 rests.

In this example, and without this being limiting, the transistor 200 is an NMOS transistor and the structure 300 is a PMOS transistor. In another embodiment, the transistor 200 is a PMOS transistor and the structure 300 is an NMOS transistor.

The step 410 of forming the protective layer 152, which preferably has a substantially constant thickness, is carried out in such a way as to cover the transistor 200 and the structure 300, that is to say, on all the surfaces, vertical and horizontal, of the devices being manufactured. This is therefore deposition than can be called conformal. Preferably, but not in a limiting way, the protective layer 152 is positioned directly in contact with the surfaces of the structures being manufactured.

This formation step 410 is preferably, but not in a limiting way, carried out using a deposition method called LPCVD, an acronym for "low pressure chemical vapour deposition." Indeed, this type of deposition carried out at atmospheric pressure allows uniform deposition on all the surfaces, regardless of the orientation of said surfaces.

This protective layer 152 can contain nitride (N) and/or silicon (Si) and/or carbon (C). Said layer has a dielectric constant less than or equal to 8.

The protective layer 152 is, for example, a layer of silicon nitride (SiN), the dielectric constant of which is equal to 8 and preferably equal to 7.

Advantageously, but not in a limiting manner, the protective layer 152 comprises a material having a low dielectric constant less than 4 and preferably less than 3.1 and preferably less than or equal to 2. For example, materials such as SiCO, SiC, SiCN, SiOCN, SiCBN, SiOCH, c-BN, boron nitride (BN) and SiO2 are qualified as "low-k" materials, that is to say, having a low dielectric constant. The material of the protective layer 152 taken from the "low-k" materials such as above thus allows the parasitic capacitance to be reduced in order to improve the performance of the transistor.

The invention, however, is not limited to the examples of materials above. The protective layer 152 can be made from another material having a low dielectric constant less than or equal to 8 and preferably equal to 7.

In an advantageous embodiment, the protective layer 152 is a porous layer. Alternatively, the protective layer 152 is a non-porous layer.

Preferably, the material of the protective layer 152 is compatible with dry or wet cleaning carried out in a subsequent step 470 in order to remove a modified protective layer 158 (described later).

The thickness of the protective layer 152 is preferably sufficiently large for non-modified portions 152*a*, 152*b* of the protective layer 152 to remain on the sides of the gate 120 after the steps of modification 430 and removal 470 are carried out.

In a preferred embodiment, the thickness of the protective layer 152 is between 5 nm and 30 nm, preferably between 5 nm and 20 nm, preferably approximately 10 nm.

Preferably, but only optionally, the method of the invention comprises an optional step of reducing the dielectric constant of the protective layer 152. In an advantageous embodiment, the reduction of the dielectric constant is obtained during the step of depositing the protective layer 152.

In one embodiment, the reduction of the dielectric constant comprises the introduction, into the protective layer 152 being formed, of precursors that form bonds that reduce the polarisability of the layer 152. These precursors are chosen in such a way as to form bonds less polar than the silicon nitride, such as Si—F, SiOF, Si—O, C—C, C—H and Si—CH3.

According to another embodiment that is an alternative to or can be combined with the previous embodiment, the reduction of the dielectric constant comprises the introduction of porosity into the protective layer 152 being formed.

Figure 4B:
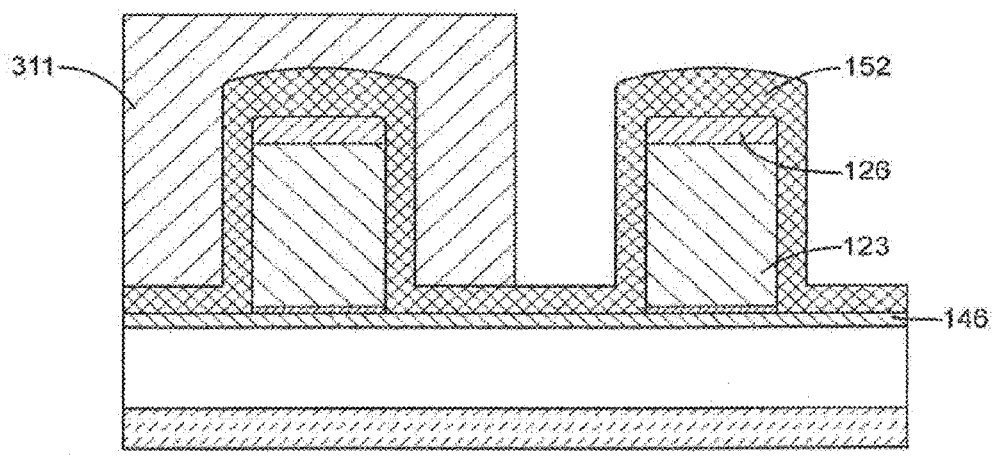

FIG. 4*b* illustrates the stack after a step 310 of deposition of a layer 311 comprising carbon.

This layer 311 comprising carbon being distinct from said transistor 200. In a preferred embodiment, this layer 311 comprising carbon is configured to cover, typically in order to encapsulate, the structure 300 distinct from said transistor 200, the structure 300 and said transistor 200 being on the same substrate 140. This layer 311 comprising carbon can act as protection for the structure said layer covers. Said layer forms, for example, a masking block as illustrated in FIG. 4*b*.

Preferably, the layer 311 comprising carbon is a layer of photosensitive or heat-sensitive resin comprising carbon. In the context of the present invention, a resin is a material that can be shaped via exposure to a beam of electrons, of photons or of X-rays, or mechanically. In another embodiment, the layer 311 comprising carbon is a hard mask comprising carbon and is preferably formed by carbon.

In another embodiment, this layer 311 comprising carbon is one of: a layer of polymer, amorphous carbon, an anti-reflective layer usually designated by the acronym thereof, BARC, for bottom anti-reflective coating, a layer containing carbon deposited via spin coating (spin-on carbon). Said layer comprising carbon can also be one of these layers associated with a layer of resin.

Said layer can also be resin alone, said resin comprising carbon.

Figure 4C:
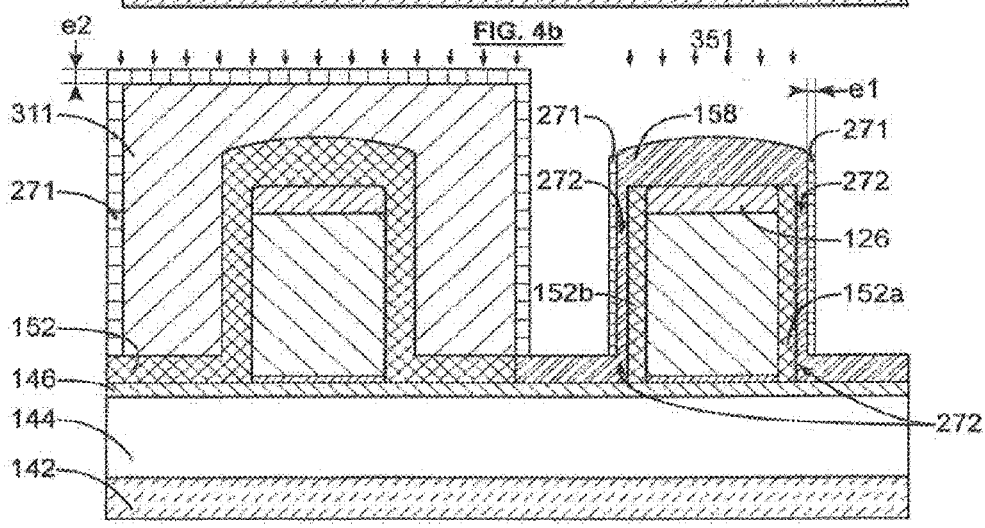

FIG. 4c illustrates the stack after the step 430 of modifying the protective layer 152 and forming a carbon film 271.

The step 430 of modifying the protective layer 152 as formed after step 410 is carried out by placing the protective layer 152 in the presence of a plasma comprising ions heavier than hydrogen and CxHy, where x is the proportion of carbon and y is the proportion of hydrogen and ions heavier than hydrogen, in order to form a modified protective layer 158 and a carbon film 271.

Thus, the species of the plasma carry out at least three functions. These three functions will be explained in detail in the description below.

"a" depositing a protective layer formed by the carbon film 271 on the sides of the gate 120 and on the layer 311 comprising carbon when said layer is present;

"b" preventing the formation of the carbon film 271 on the surfaces perpendicular to the sides of the gate 120;

"c" modifying the protective layer 152 over the entire thickness thereof or over a significant thickness thereof on the surfaces perpendicular to the sides of the gate 120 and modifying the protective layer 152 over a lesser thickness on the sides of the gate 120. Preferably, the protective layer 152 located on the top of the gate 120 and on either side of the gate 120 is completely modified while the protective layer 152 located on the sides of the gate 120 is not modified or modified over a lesser thickness.

CxHy, for example methane (CH4), is introduced into the plasma in order to carry out the functions "a" and "c". The chemical species of the plasma containing carbon coming from the CH4 or more generally from the CxHy carry out the function "a". To carry out the function "b", the plasma comprises ions heavier than hydrogen such as helium (He), argon (Ar), nitrogen (N2), xenon (Xe) and oxygen (O2). For reasons of conciseness, these ions will be designated as "heavy ions" in the rest of the description.

The function "c" is carried out by ions made from hydrogen. The ions made from hydrogen are preferably taken from: H, $H^+$, $H_2^+$, $H_3^+$. In the rest of the description, and for reasons of conciseness, the ions made from hydrogen will be called "hydrogen ions". These ions have the property of easily penetrating deep into the protective layer 152. Said ions thus modify the protective layer 152 without pulverising said layer. The heavy ions penetrate much less deeply into the protective layer 152. These heavy ions remain localised at the surface and are not therefore suitable for modifying a significant thickness, and, a fortiori, the entire thickness, of the protective layer 152. The depth of penetration of the heavy ions is approximately ten times less than the depth of penetration of the hydrogen ions.

More precisely, the ions made from hydrogen can be implanted in the material to be etched without causing dislocation of the atomic structure of said material such that said dislocation would lead to pulverisation of said material, and thus without re-deposition of the etched material onto the walls of the reactor or the patterns being etched themselves, are capable of being suitable.

An additional function is carried out by the heavy ions. This additional function involves dissociating the CxHy molecule in order to free the species H. Helium (He) is particularly effective in carrying out this function. The mixture introduced into the plasma reactor thus preferably comprises a CxHy/He mixture.

It should be noted here that this step 430 of modifying the layer to be etched can be carried out in numerous different ways by adapting all sorts of means routinely used by the microelectronics industry. In particular, standard etching is used, in which plasmas having a low or high density can be developed and where the energy of the ions can be controlled in order to allow the implantation of the light species above intended to modify the layer to be etched. A type of plasma called immersion plasma, routinely used to carry out implantation of species on the surface of a device being manufactured, can also be used.

A modification of the layer carried out via implantation using a plasma has the advantage of allowing continuous implantation from the free surface of the protective layer 152 and over a small thickness, typically between 0 and 100 nm or even between 0 and 30 nm. Said modification also provides improved selectivity from the start of the etching and a constant etching rate, leading to improved etching precision.

The use of a plasma to implant the protective layer 152 thus allows a very fine layer to be removed, typically between 1 and 10 nm and more generally between 1 and 30 nm.

This modification step 430 is carried out in order for the plasma to be anisotropic in such a way as to bombard the ions in a favoured direction 351 parallel to the sides of the gate 120. The plasma used during this step 430 creates a bombardment of ions made from hydrogen (H) coming from the molecule of the CxHy and being implanted in an upper portion of the thickness of the protective layer 152 on the sides of the gate 120. These ions made from hydrogen come from the CxHy, the molecule of which is dissociated by the ions heavier than hydrogen of the plasma.

Thus, the ions modify the surfaces perpendicular to the direction of the bombardment over a greater thickness than the surfaces parallel to the direction of the bombardment. Thus, the upper portion of the thickness of the protective layer 152 on the sides of the gate 120 is modified over a lesser thickness than the surface on the top of the gate 120 and the surfaces of the protective layer 152 covering the active layer 146. A non-modified thickness 152a, 152b of the protective layer 152 covering the sides of the gate 120 is preserved and will become the spacers 152a, 152b.

Thus, the ions made from hydrogen penetrate the protective layer 152 in order to modify said layer. At the same time, the CxHy, preferably CH4, of the plasma tends to deposit a carbon film 271 on the various walls.

The bombardment of ions heavier than hydrogen allows the carbon species coming from the CxHy to form the carbon film 271, in particular on surfaces parallel to the direction of the bombardment, while preventing a carbon film 271 from being formed on the surfaces of the protective layer 152 that are perpendicular to the direction 351 of the bombardment, such as the bottom of the trenches. Indeed, the heavy ions of the plasma pulverise the carbon species coming from the CxHy that would tend to form on these walls perpendicular to the implantation direction and thus prevent the growth of this carbon film 271 on these walls perpendicular to the implantation direction.

However, on the surfaces that receive less bombardment or that do not receive any bombardment, this carbon film 271 is formed. Thus, said film is formed in particular on the surfaces parallel to the direction 351 of bombardment.

It should be noted that in a particularly advantageous manner, the carbon film 271 acts as a carbon protective layer for the protective layer 152 that said layer covers, reducing the thickness over which the hydrogen ions penetrate the protective layer 152, and modifies said protective layer. Thus, the carbon film 271 allows the difference in the modification thickness between the surfaces covered by the carbon film 271 and the surfaces not covered by said film to be increased. The thickness etched is thus even better controlled.

During said step of modifying the layer to be etched, the concentration of CxHy in the plasma is preferably between 2% and 50% of the total flow rate and preferably between 8% and 40%. Anything more would be deposition mode.

The dilution depends on the choice of the species of the heavy ions of the plasma, He, N2, Ar or O2, etc. For example:

for He or Ar, the flow rate of CxHy must be less than 4% of the total flow rate;
for N2, the flow rate of CxHy must be less than 20% of the total flow rate;
for O2, the flow rate of CxHy must be less than 50% of the total flow rate.

During said step of modifying the layer to be etched, the concentration of ions heavier than hydrogen in the plasma is between 50% and 98% and preferably between 55% and 85% and of 60% and 80%. These concentrations are usually measured by a ratio between the two gaseous components.

In the present patent application, a ratio between two gaseous components is a ratio relating to the respective flow rates of introduction of the components into the plasma reactor. Each flow rate is usually measured in sccm. Typically, a flow rate is measured with a flowmeter associated with the reactor.

In an embodiment (as previously illustrated) using an He/CH4 plasma preferably in the form of a mixture, the protective layer 152 is modified by the H ions coming from the CH4 gas. The He ions destroy or prevent the formation of the carbon film 271 that would tend to form on the surfaces perpendicular to the direction 351 such as the surfaces of the modified protective layer 158 covering the active layer 146, and the hard mask 126 on the top of the gate 120.

In another embodiment using an H2/CH4/Ar plasma, in addition to the hydrogen ions, the nature of the Argon ions and the parameters of the plasma, in particular the energy thereof, allow a depletion of the methyl groups of the carbon film 271 to be carried out anisotropically in such a way that the carbon film 271 is not formed on the surfaces, such as above, perpendicular to the direction 351.

Thus, the argon, optionally alone, also allows the formation of the carbon film on the surfaces perpendicular to the direction 351 of bombardment to be prevented. Combined with He, N2, Xe and/or O2, the argon contributes to the pulverisation of the carbon film 271 that would tend to be formed.

Thus, the heavy ions Ar, He, N2, Xe or O2 allow the action of the ions made from hydrogen to be reinforced by also preventing the formation of the carbon film 271 on the surfaces perpendicular to the main direction 351 of the bombardment.

It should be noted that in all these embodiments, the H ions of the CH4 participate, in synergy with the heavy ions of the plasma (He, Ar, N2, Xe or O2, for example), in the modification of the portion 158 of the protective layer 152, even if the depth of penetration of these heavy ions is smaller than the depth of penetration of the ions made from hydrogen.

Thus, after this modification step 430, the carbon film 271 formed only covers the surfaces of the protective layer 152 that are perpendicular or highly inclined with respect to the plane of the substrate 140, such as the upper surfaces of the modified protective layer 158 on the sides of the gate 120 and the walls or sides of the layer 311 comprising carbon.

It should be noted that, unexpectedly, the carbon film 271 is formed on the walls of the layer 311 comprising carbon. The ions of the plasma do not pulverise the carbon film 271 formed on the walls of the layer 311 comprising carbon. It is probable that this is caused by the chemical affinities and molecular reactions between the carbon of the layer 311 and the chemical species containing carbon coming from the CxHy. This affinity accelerates the attainment of a deposition mode and promotes the formation of the carbon film 271 on the layer 311 comprising carbon. The carbon film 271 is thus rapidly formed despite the bombardment of the heavy ions. This carbon film 271 thus acts as a protective layer for the layer 311 comprising carbon and prevents said layer from being degraded by the ion bombardment. The dimensions of the layer 311 are thus preserved despite the ion bombardment.

Because of the molecular reactions above, the thickness e2 of the carbon film 271 covering the walls of the layer 311 comprising carbon is greater than the thickness e1 of the carbon film 271 on the protective layer 152 (on the sides of the gate 120). Even more advantageously, the thickness e2 of the carbon film 271 is at least two times greater than the thickness e1 of the carbon film 271. The thicknesses e1 and e2 appear in FIG. 4c.

Thus, the carbon film 271 acts as a protective layer for the layer 311 comprising carbon, preventing or reducing the modification of said layer under the effect of the ion bombardment.

It should be noted here that the modification step 430 can be carried out in numerous different ways by adapting all sorts of means routinely used by the microelectronics industry, such as using any type of etcher, for example in an ICP reactor, from "Inductively Coupled Plasma", or in a CCP reactor, from "Capacitive Coupled Plasma", that allows the energy of the ions to be controlled. A type of plasma called immersion plasma, routinely used to carry out implantation of species on the surface of a device being manufactured, can also be used.

To choose the implantation parameters, a person skilled in the art, in order to determine the behaviour of the material to be etched in the type of implanter chosen, would first preferably carry out "full plate" tests in order to establish behaviour curves. From this, a person skilled in the art would deduce implantation parameters, in particular the energy and the dose of ions, that is to say, the exposure time, to be used for reaching the desired thickness of material to be modified.

For example, the table below gives typical conditions of implementation of the step 430 of modifying the protective layer 152, carried out using an He/CH4, H2/CH4/Ar, CH4/Ar, CH4/N2 or CH4/N2/H2 plasma, according to the time in seconds and the power of the polarisation (bias) in watts, etc. These conditions are largely dependent on the thickness of the protective layer 152 to be modified.

In the example below, the protective layer 152 is a layer containing nitride, such as a layer of silicon nitride.

| Etching reactor: | ICP or CCP or immersion reactor |
|---|---|
| | He/CH4 plasma |
| | (He: 50-500 sccm, CH4: 5-10 sccm), or |
| | H2/CH4/Ar or H2/CH4/N2 plasma |
| | (H2: 50-500 sccm, CH: 5-15 sccm, |
| | Ar (Argon) or N2: 100-1000 sccm) |

-continued

| | |
|---|---|
| Thickness of the protective layer 152 to be modified (thickness of the modified protective layer 158): | 1 - approximately ten nm, for example 6-10 nm |
| Power of the source: | 0-2000 Watts |
| Polarisation power (energy of the ions): | 20-850 V |
| Pressure: | 5 milli-Torr-120 milli-Torr |
| Temperature: | 10-100° C. |
| Time: | several seconds to several hundred seconds |

A more accurate example of implementation of the modification step 430, allowing a thickness of 17 nm of nitride to be modified, carried out with the use of an He/CH4 plasma, is described in the table below:

| | |
|---|---|
| Etching reactor: | He/CH4 plasma (He: 250 sccm, CH4: 5 sccm) |
| Thickness of the layer 152 containing nitride to be modified (thickness of the modified layer 158 containing nitride): | 14 nm |
| Power of the source: | 500 W |
| Polarisation power (energy of the ions): | 250 V |
| Pressure: | 10 milli-Torr |
| Temperature: | 55° C.-59° C. |
| Time: | 60 seconds |

Preferably, the protective layer 152 is modified over the entire thickness thereof above the gate 120 and above the active layer 146 while leaving in place non-modified portions 152a, 152b of the protective layer 152 on the sides of the gate 120.

Figure 4D:
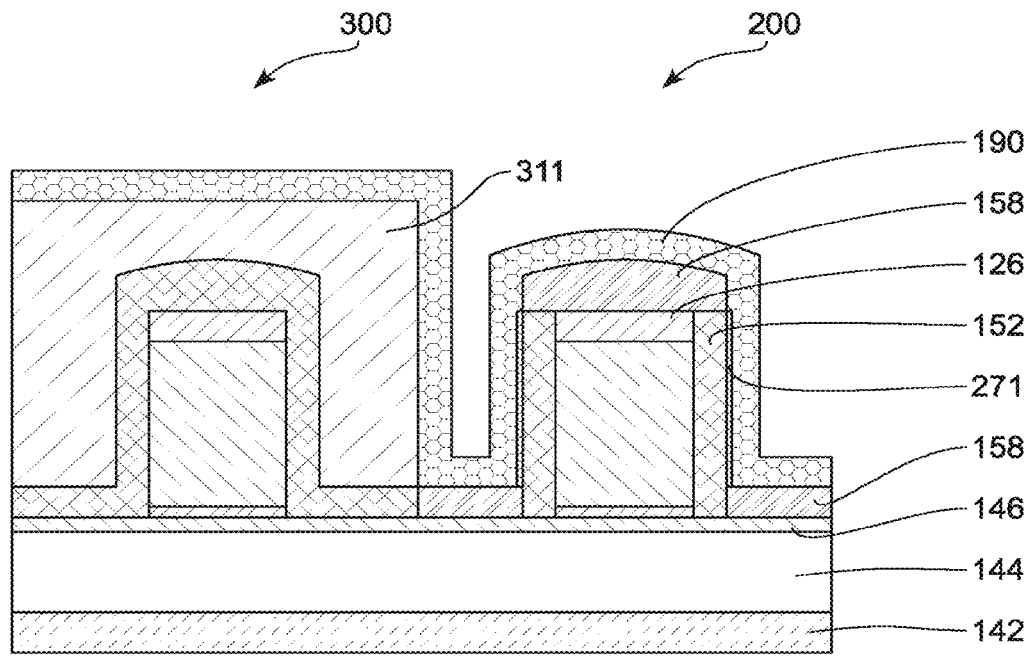

FIG. 4d illustrates the result of a step 440 of forming a protective film 190 on all the surfaces of the stack.

For example, the conformal deposition of a protective film 190 of oxide or of nitride on all of the structure is carried out, that is to say, in particular on:
  all the surfaces covered by the layer 152 that are not protected by the layer 311 comprising carbon, the layer of resin typically including the regions that were modified in the previous step via ion implantation and the regions that were not thus modified because of the anisotropic nature of this implantation;
  The sides of the spacers that were covered by the carbon film 271;
  all the surfaces covered by the layer 311 comprising carbon.

The formation 440 of this protective film 190 of oxide or of nitride is intended to reinforce the protection of the regions located on the sides of the gate 120, regions that will form, in fine, the spacers. In particular, the protective film 190 is intended to prevent the carbon film 271 obtained during the previous step 430 of modification via implantation from being removed during the following step 460 of removal of the protective film 190.

In order to not add an additional step into a production line, the deposition 440 of the protective film 190 is preferably carried out in the same chamber as the previous step 430 of modification via implantation. However, it is perfectly possible for these two steps 430, 440 to be carried out in two separate chambers.

It should be noted that the formation 440 of the protective film 190 must necessarily be carried out on the resin 470 in order to be able to protect the regions of the spacers located on the sides of the gates. Indeed, if the material were not deposited on the layer 311 containing carbon, the material would also not be deposited on the carbon film 271.

Figure 5:
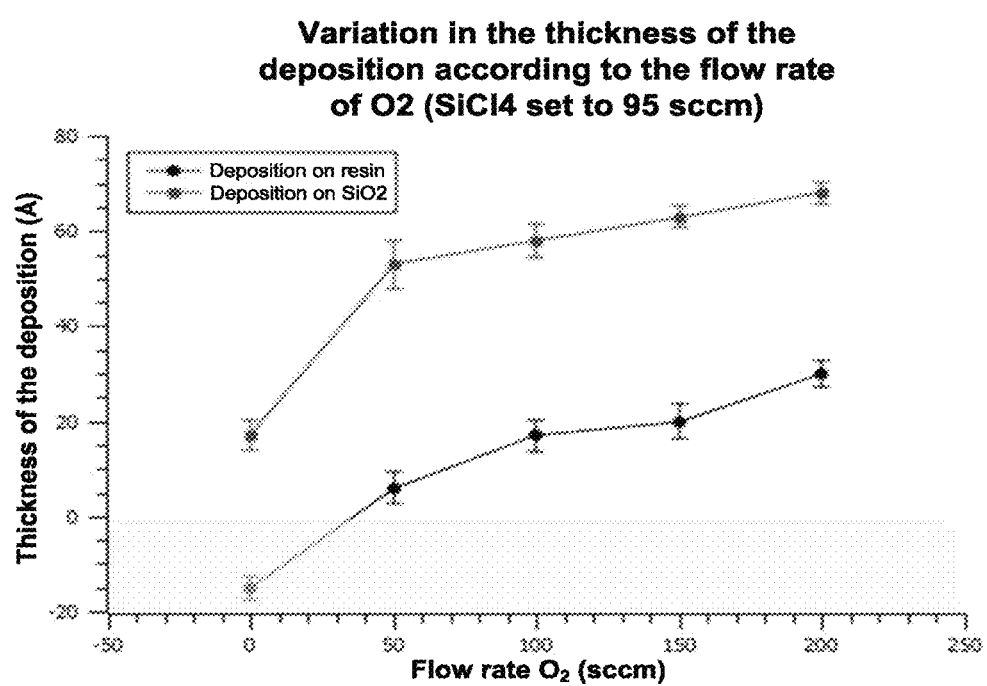
FIG. 5 shows the thickness of the protective layer obtained according to the deposition conditions.

To do this, in order to form this protective film 190 via deposition, it is advantageous to associate two types of gas: a gas containing silicon and a diluent gas, for example silicon tetrachloride ($SiCl_4$) and oxygen ($O_2$). As illustrated in FIG. 5, it should be noted that the gas flow rates used for the deposition must then be greater than a threshold in order to actually be in a mode of deposition on the resin. In FIG. 5, which illustrates deposition using $SiCl_4$, with a flow rate for this gas set to 95 sccm (cubic centimeters per minute) in this case, the flow rate of oxygen in order for there to actually be growth on the resin must then be greater than a threshold 510, which in this example is 30 sccm.

More generally, this deposition 440 of the protective film 190 can be carried out using a plasma formed from a gas containing silicon such as the $SiCl_4$ mentioned above or $SiF_4$ and a gas such as $O_2$ or $N_2$.

However, there is a maximum margin to not be exceeded in the deposition 440 of the protective film 190. It must be possible to observe the patterns, that is to say, the various structures such as the transistors being formed and the gates thereof in particular. The height of the deposition of the protective film 190 is therefore less than the smaller of the two following lengths:
  the height of the gate 123 plus the height of the hard mask 126.
  the half-period between transistors 200, 300 minus the length of a half-gate and of a spacer.

Figure 4E:
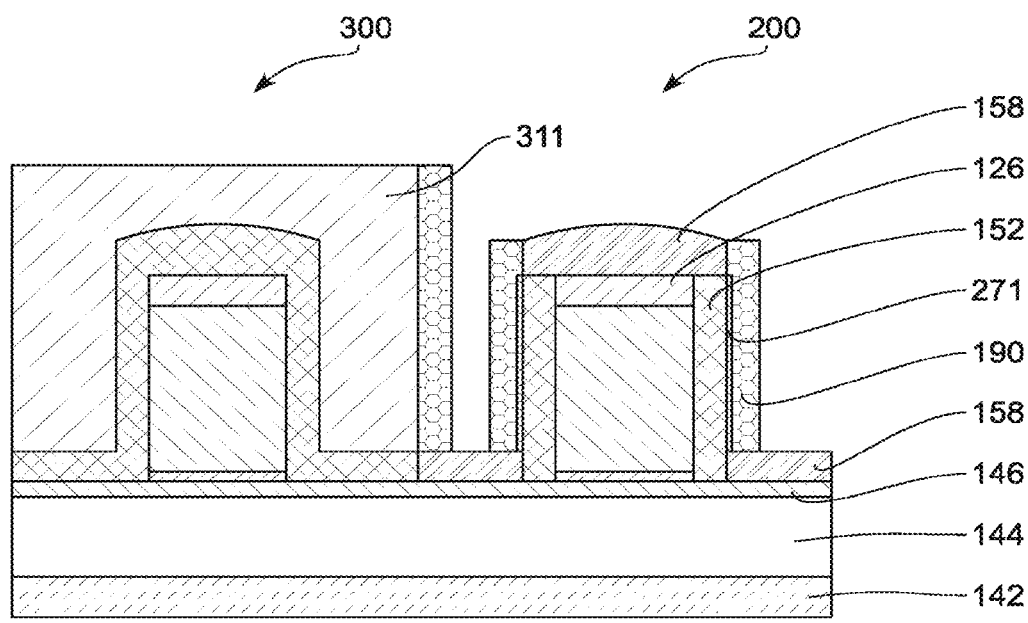

FIG. 4e illustrates a step 450 of partial removal of the protective film 190 that was just deposited on the entirety of the structure.

This step of 450 removal is carried out anisotropically in order to preserve the protective film 190 on the sides of the gate and remove said film in particular on the top of the masking block formed by the layer 311 comprising carbon and on the top of the gate. More generally, this removal 450 is carried out in an etching chamber, typically via plasma, in a direction such that the surfaces perpendicular to the sides of the gate are etched and the surfaces parallel to the sides of the gate are not etched.

In order to not add an additional step into a production line, the deposition 440 of the protective film 190 is preferably carried out in the same chamber as the previous step. However, it is perfectly possible for these two steps 440 and 450 to be carried out in two separate chambers.

The regions of the carbon film that remain after this removal provide a second protection, in addition to the carbon film 271, to the portions of the protective layer 152 that will form, in fine, the gate spacers of the transistors.

To do this, a noble gas such as helium (He), argon (Ar) or Xenon (Xe) that does not chemically react with the previous deposition is introduced into the chamber that was used for the deposition of this film 190 while applying a polarisation or "bias" of the plasma that will determine the force of the ion bombardment that allows selective removal of that which was formed in the previous step.

Figure 4F:
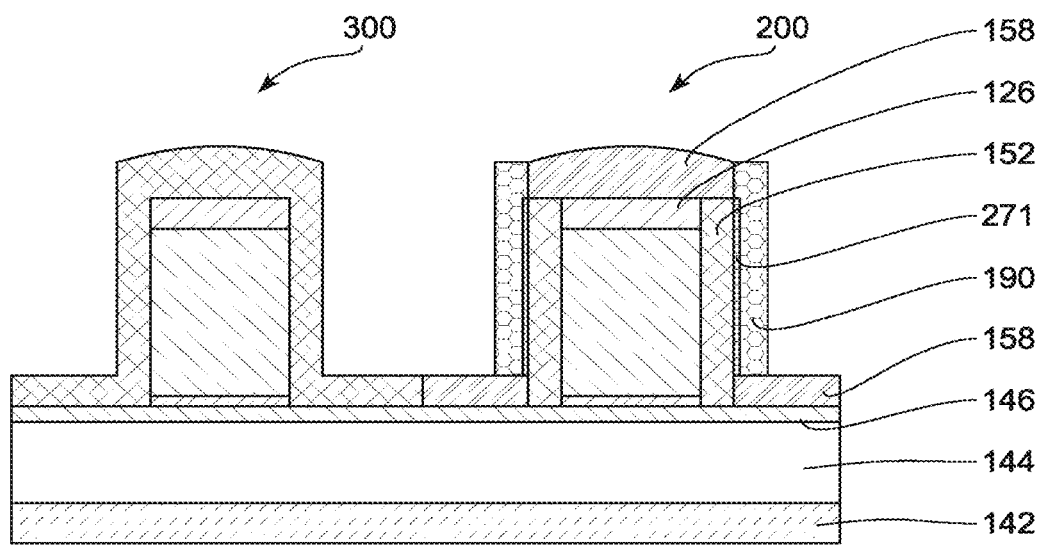

FIG. 4f illustrates a step 460 of removal of the layer 311 comprising carbon and forming, for example, a layer of resin that protects the transistors 300 of the type opposite to the type 200 for which the spacers are formed. The choice of the chemistry used is made according to the type of protective film 190 formed during the step 440. If this film 190 is formed via deposition of oxide, an oxidizing chemistry is then used, and in the case of nitride deposition, a reducing chemistry is used. According to the thickness of the protective film 190, said film may remain between the two transistors 200, 300. Indeed, the step 460 of removal of the layer 311 comprising carbon does not attack this film 190. Naturally, it the thickness of said film is too small in terms of height, this film sinks and is eliminated.

Figure 4G:
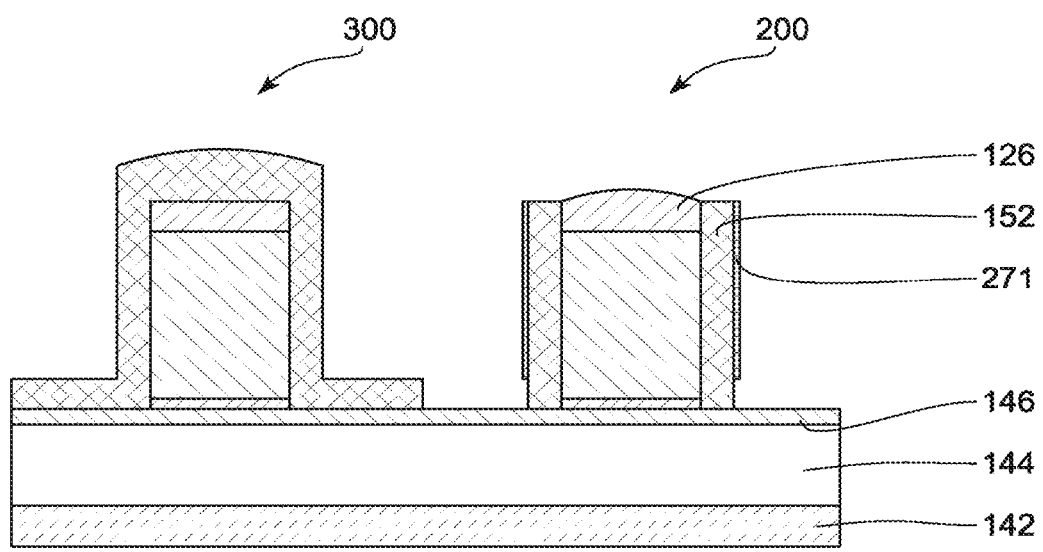

FIG. 4g illustrates the result of the step 470 of removal of the modified protective layer 158 after an operation of selective etching of the modified protective layer 158 with respect to: the carbon film 271, the non-modified portions 152a, 152b of the protective layer 152, and the active layer 146 was carried out.

Preferably, this step 470 also removes the regions of the protective film 190 preserved after the step 460 on the sides of the gate.

The etching solution thus etches the modified protective layer 158, to which said solution has direct access on the top of the gate 120 and at the bottom of the trenches.

If the ions made from hydrogen were implanted in the protective layer located on the sides of the gate, which can be the case if the carbon layer 271 is thin, a thickness of the protective layer located on the sides of the gate is then modified.

During the step of removal of the modified protective layer, the etching solution can also be introduced into the space located on the sides of the gate 120, between the carbon film 271 covering the sides and the non-modified portions 152a, 152b. In this space, occupied by the modified protective layer 158 obtained at the end of the modification step 430, the etching solution consumes the modified protective layer 158. The passages that the etching solution passed through to consume this portion of the modified protection layer 158 are labelled 272 in FIG. 4c.

In this case, the carbon film 271 is no longer supported and disappears. Typically, this disintegration of the carbon film is called "lift off".

Alternatively, if the ions made from hydrogen were not implanted in the protective layer located on the sides of the gate, which can be the case if the carbon film 271 is sufficiently thick, the protective layer located on the sides of the gate is not modified or only very slightly modified. During the step of removal of the modified protective layer, the etching solution does not therefore remove the protective layer 152 located on the sides. The carbon film 271 thus remains maintained by said layer. Said film does not therefore disappear during the step of removal of the modified protective layer. This embodiment is not illustrated in the drawings.

Advantageously, these parameters are also adjusted in such a way that the modified protection layer 158 can be selectively etched with respect to the semi-conductor material of the active layer 146.

In an embodiment in which the modified protective layer 158 is typically a layer containing nitride, the step 470 of removal can be carried out via wet etching using an etching solution containing hydrofluoric acid (HF) diluted for example to 1% or phosphoric acid (H3PO4) for SiC, SiCN or SiN.

Figure 2A:
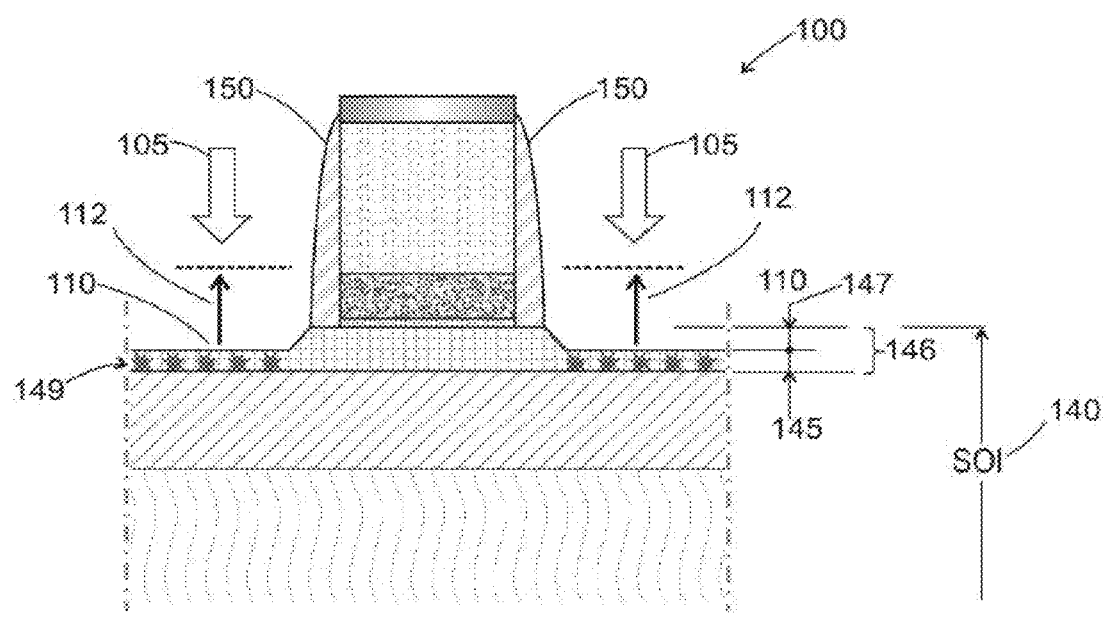
FIGS. 2a to 2e illustrate various defects that can be observed on structures of FDSOI transistors during the etching of the spacers using one or the other of the standard anisotropic etching methods developed by the microelectronics industry.
Figure 2B:
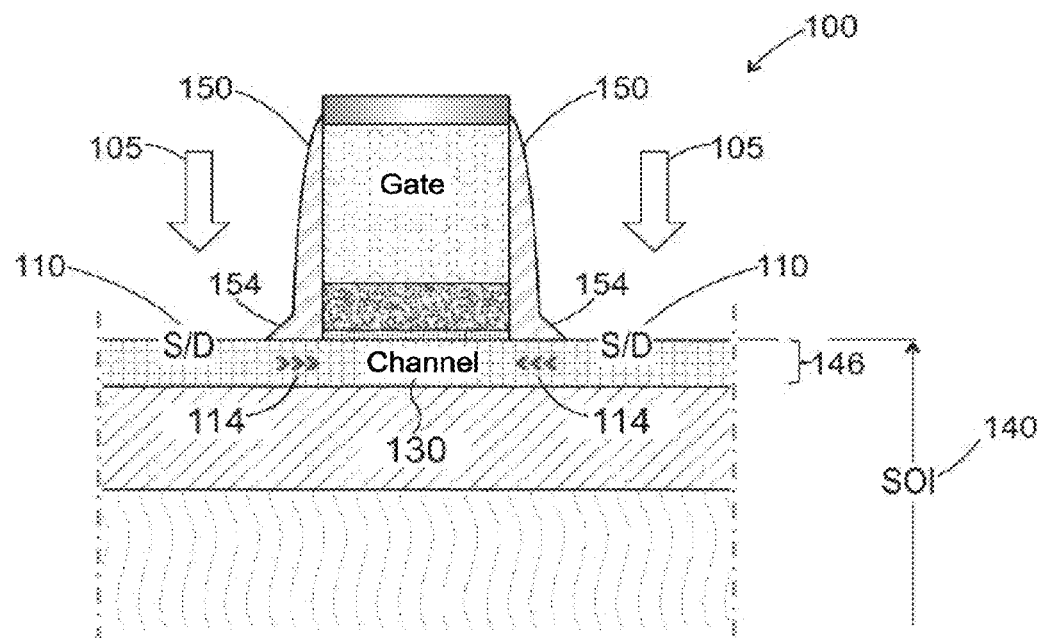
Figure 2C:
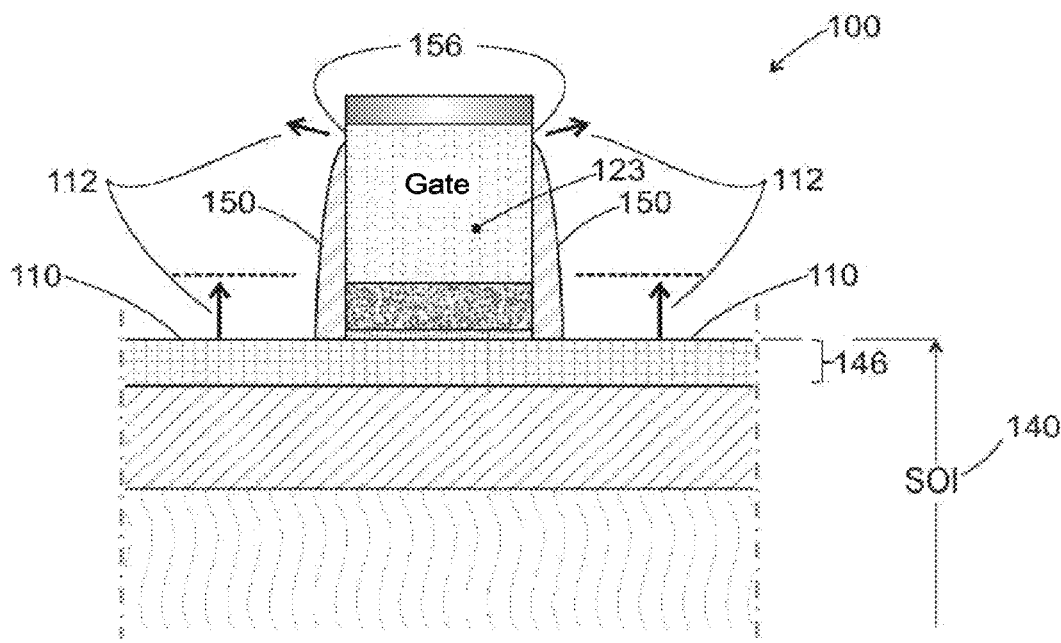
Figure 2D:
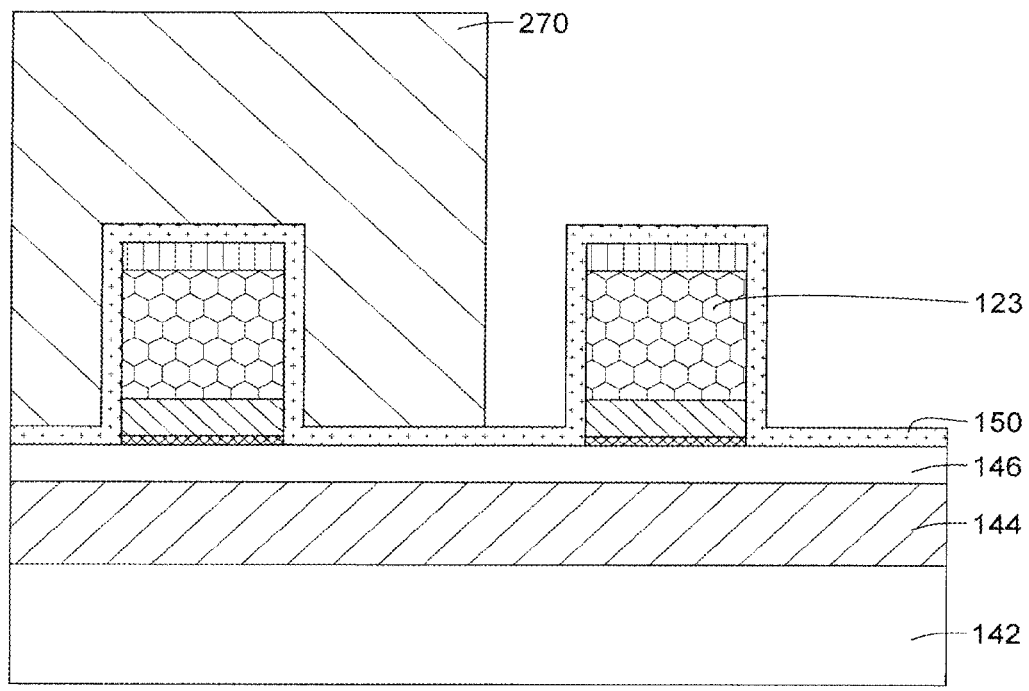
Figure 2E:
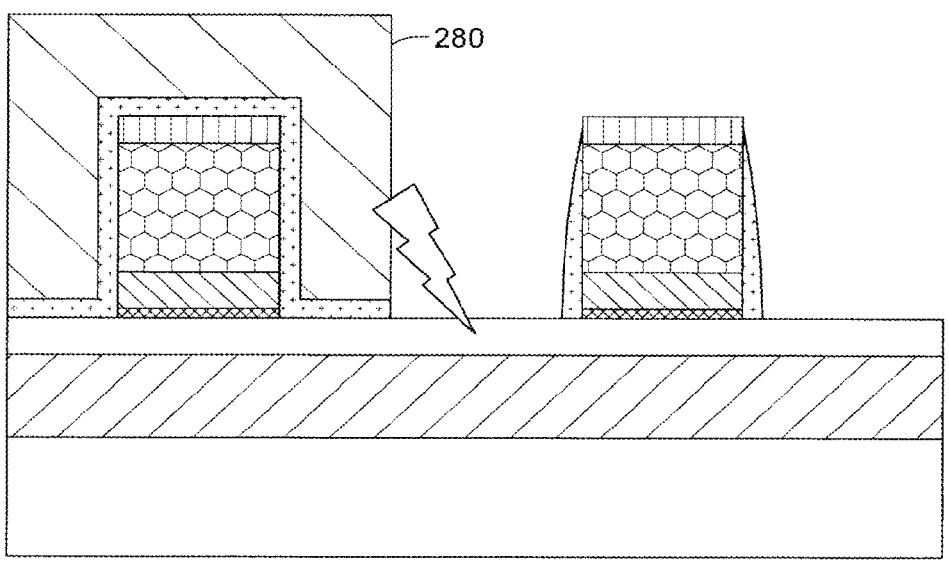
Figure 3:
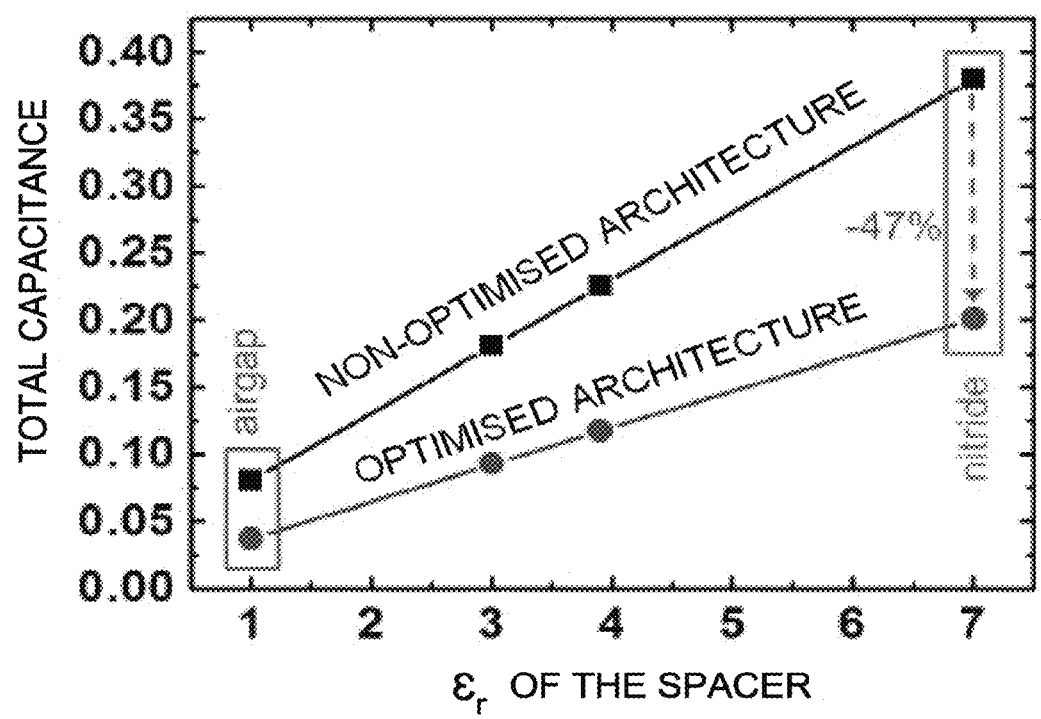
FIG. 3 illustrates another problem related to the relative increase in the parasitic capacitances associated with the spacers when the size of the transistors is reduced.

To avoid the problems of the conventional methods for etching the spacers described in FIGS. 2a to 2c, the etching of the modified protective layer 158 must be as selective as possible with respect to the silicon, in particular in order to not attack the silicon of the active layer 146. For example, in this wet etching embodiment, no silicon of the active layer 146 is consumed because of the use of the etching solution containing hydrofluoric acid (HF).

As mentioned above, the thickness of the modified protective layer 158 is typically in a range of values from 1 nm to several tens of nm. The etching times can be from several seconds to several minutes while being obviously directly dependent on the thickness that was modified.

For example, to remove a modified thickness between 5 nm and 20 nm of modified nitride, approximately 30 seconds are needed with a solution of hydrofluoric acid (HF) at 1%. The same etching time is obtained with phosphoric acid (H3PO4) diluted to 85% in order to etch a layer of silicon nitride (SiN) or SiC.

A solution of hydrofluoric acid (HF) can be used for protective layers containing materials other than nitride, silicon and carbon.

For example, to remove a modified thickness of 15 nm of modified SiCBN, approximately 30 seconds are needed with a solution of hydrofluoric acid (HF) at 1%.

Said selective etching can thus be stopped on the non-modified portions 152a, 152b of the protective layer 152 and/or on the monocrystalline silicon of the active layer 146 and/or also on the hard mask 126 on the top of the gate 120 until the modified protective layer 158 disappears.

To remove the modified protective layer 158, wet etching is preferably used that combines the removal of the modified protective layer 158 with wet cleaning of the wafer containing the devices being manufactured, because after this wet etching, wet cleaning is conventionally carried out in order to clean a wafer on which the transistor 200 is located.

Preferably, this wet etching is combined with the wet cleaning, which simplifies the method and saves time.

The parameters of the wet cleaning are also adjusted in such a way that the modified protective layer 158 can be etched very selectively with respect to the species containing carbon of the carbon film 271 in particular covering the walls of the layer 311 comprising carbon, and with respect to the non-modified portions (the spacers obtained) 152a, 152b of the protective layer 152.

As an alternative to wet etching, dry etching of the modified protective layer 158, selectively with respect to the silicon of the active layer 146, the material of the spacers 152a, 152b, the silicon oxide (SiO2) of the hard mask 126, can therefore also be carried out for this step 470 of dry-process removal of the modified protective layer 158.

Figure 7:
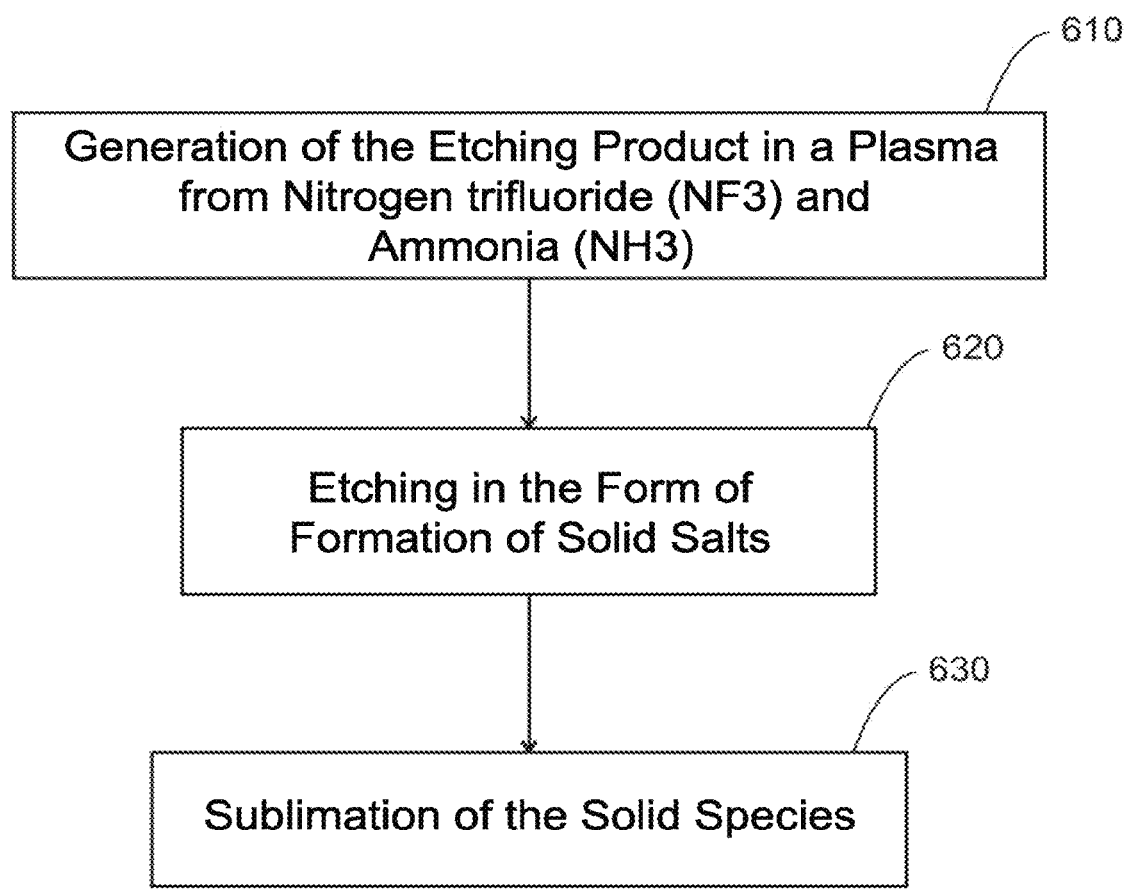
FIG. 7 illustrates the steps of the dry removal of the modified protective layer.

The principle of dry-process removal of the modified protective layer 158, typically a modified layer 158 containing nitride, comprises the following steps 610 to 630 illustrated in FIG. 7, which are carried out in a reaction chamber in which a plasma is formed. The thicknesses treated are typically between 1 nm and several tens of nanometers.

The method is the method described by H. Nishini and co-authors in an English publication entitled "Damage-free selective etching of Si native oxides using NH3/NF3 and SF6/H2O down flow etching," published in the Journal of Applied Physics, volume 74 (2), in July 1993.

The principle of the dry-process removal of the modified protective layer 158 is close to the method described in the above publication. The difference is that in the case of the invention, the silicon oxide is not etched, but the modified protective layer 158 is etched using a plasma such as an H2/CH4/Ar plasma.

The mechanism, however, is the same and comprises the following steps carried out in a reaction chamber in which a plasma is formed. A first step 610 involves generating the etching product in the plasma via the following chemical reaction:

which reacts nitrogen trifluoride (NF$_3$) with ammonia (NH$_3$).

The etching is carried out in a second step 620, at a temperature of approximately 30° C. and more generally between 10° C. and 50° C., in the form of the formation of salts according to the following chemical reaction:

NH$_4$F or NH$_4$F.HF+SiNH→(NH$_4$)2SiF$_6$ (solid)+H$_2$

During an operation that lasts between several seconds and several minutes and is carried out at a pressure between several milli-Torr and several Torr. More precisely, this operation last between 20 seconds and 2 minutes and is carried out at a pressure between 500 milli-Torr and 3 Torr.

The solid species that are formed during this operation are then sublimed 630 at a temperature greater than 100° C. for several tens of seconds according to the following reaction:

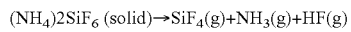

(NH$_4$)2SiF$_6$ (solid)→SiF$_4$(g)+NH$_3$(g)+HF(g)

For example, to remove a layer of 10 nm of modified nitride 158, the flows of nitrogen trifluoride (NF$_3$) and ammonia (NH$_3$) are, respectively, 50 sccm and 300 sccm at 30° C. for 45 seconds for the step 620 of formation of the salts, which is followed by the step 630 of sublimation that is carried out at 180° C. for 60 seconds.

This embodiment allows very good selectivity of the etching of the modified protective layer 158 with respect to the non-modified portions 152a, 152b and with respect to the non-modified semiconductor material to be obtained. In particular, this selectivity of the etching is much greater (typically by a factor of at least 10) than the selectivity obtained with a solution of HF.

After the removal step 470, only the non-modified portions 152a, 152b of the initial protective layer 152 remain, essentially on the sides of the stack of layers that form the gate 120. These non-modified portions 152a, 152b form the spacers 152a, 152b for the gate 120 of the transistor 200 for example of the FDSOI type. Moreover, the etching of the modified protective layer 158 can also be carried out for the creation of the spacers of a FinFET three-dimensional transistor, without this use being limiting to the invention.

Additional steps can for example be standard steps in which the extensions of the source/drain regions via ion implantation of dopants before epitaxial growth of the raised sources/drains of FDSOI transistors are possibly carried out.

As mentioned above, the embodiment illustrated in FIGS. 4a to 4g shows the manufacturing of the spacers 152a, 152b of the transistor 200 for example of the PMOS type, without consuming the layer 311 comprising carbon covering the structure 300 such as an NMOS transistor, in order to prevent the layer 311 comprising carbon from being damaged by the execution of the steps of modification 430 and removal 460 and 470.

The method of the invention can be used to manufacture microelectronic devices on the same substrate on which none of the devices being manufactured are covered and protected by a protective layer such as the layer 311 comprising carbon.

The following paragraphs give non-limiting implementation conditions for the steps of embodiments of the method according to the invention.

Deposition 410 of the protective layer 152 intended to form the gate spacers: the thickness is typically in a range from 5 to 20 nanometers (nm) without the invention being limited to these values. The materials that can be suitable include silicon nitride (SiN), as well as the materials called "low-k" materials, including silicon oxycarbide (SiCO), silicon carbide (SiC), silicon carbonitride (SiCN), and other compounds such as SiOCN and SiCBN in a porous or non-porous form.

Modification 430 via implantation of the protective layer 152 intended to form the spacers: said implantation is carried out in any type of plasma etcher and in particular in the etchers called ICP etchers, acronym for "inductive coupled plasma", provided with a means for controlling the energy of the ions. The thickness modified is typically in a range from 1 to several tens of nanometers. The conditions are typically those of the table below. The broad adjustment ranges below are highly dependent on the uses and on the thicknesses of the films. For example, to modify silicon nitride over a thickness of 17 nm, the specific conditions are: pressure (mTorr)=10; RF bias voltage (volts)=250; time (sec)=60; He=250 sccm; CH4=10 sccm; TCP RF Power (watts)=250V.

| Chemistry: | He/CH4 or H2/CH4/Ar |
|---|---|
| Power of the source: | 0-2000 Watts |
| H2: | 10-500 sccm |
| He: | 10-500 sccm |
| Ar: | 100-1000 sccm |
| CH4: | 5-15 sccm |
| Polarisation ("bias"): | 20 V to 500 V |
| Pressure: | 5 mTorr to 100 mTorr |
| Temperature: | 10° C. to 100° C. |
| Time: | From several seconds to several hundred seconds. |

Formation 440 of the protective film 190: preferably in the same reactor as for the step 430 above (ICP). The deposition is carried out on the layer 311 comprising carbon, typically a photosensitive resin, and on the material forming the spacers. The conditions are typically those of the table below. The low deposition times are independent of the uses. The specific conditions for deposition of 10 nm of oxide are, for example: pressure (mTorr)=10; RF bias voltage (v)=0; time (sec)=10; SiCl4=95 sccm; O2=50 sccm; TCP RF Power (watts)=100.

| Conditions: | Gas containing silicon SiCl4 or SiF4 and a diluent, for example: O2 or N2. |
|---|---|
| Power of the source: | 0-2000 Watts |
| Gas containing Si: | 10-200 sccm |
| Diluent: | 5-500 sccm |
| Polarisation ("bias"): | 0 V to 200 V |
| Pressure: | 5 mTorr to 100 mTorr |
| Temperature: | 10° C. to 100° C. |
| Time: | Several seconds |

Removal 450 of the protective film 190 on the surfaces parallel to the plane of the stack: preferably in the same reactor as above for the steps 430, 440 (ICP). The conditions are typically those in the table below. The etching time used during this step is directly dependent on the previous step, for example if 15 nm are deposited on the layer 311 containing carbon, the etching time of the step 450 must be sufficiently long to remove the 15 nm of deposition. The specific conditions for removal of a thickness of 10 nm are, for example: pressure (mTorr)=10; RF bias voltage (v)=150; time (sec)=300; Ar=475 sccm; TCP RF Power (w)=100.

| Conditions: | Use of neutral gas. |
|---|---|
| Power of the source: | 100-2000 Watts |
| Neutral gas: | 10-500 sccm |
| Polarisation ("bias"): | 0 V to 600 V |
| Pressure: | 5 mTorr to 100 mTorr |
| Temperature: | 10° C. to 100° C. |
| Time: | several seconds to several hundred seconds |

Removal 460 of the layer 311 comprising carbon (resin for example): carried out in any type of inductively coupled etcher (ICP) like above or capacitively coupled etcher (CCP) or remote plasma etcher (remote plasma/downstream).

The conditions are typically those of the table below. The specific conditions for the removal of a thickness of 240 nm are, for example: pressure (mTorr)=10; RF bias voltage (v)=0; time (sec)=45; $O_2$=200 sccm; TCP RF Power (w)=600.

| Conditions: | The gas used by this operation is determined by the type of material deposited. $O_2$ is used if the deposition was made using $SiCl_4/O_2$ and $N_2$ if $SiCl_4/N_2$ was used. |
|---|---|
| Power of the source: | 100-2000 Watts |
| $N_2$: | 30-500 sccm |
| $H_2$: | 30-500 sccm |
| $O_2$: | 30-500 sccm |
| Polarisation ("bias"): | 0 V to 850 V |
| Pressure: | 5 mTorr to 100 mTorr |
| Temperature: | 10° C. to 400° C. |
| Time: | from several seconds to several hundred seconds |

Removal 470 of the modified layer 158 of the material forming the spacers: carried out via wet etching. The thickness of the modified layer to be removed is typically between 1 and several tens of nanometers with a solution containing hydrofluoric acid (HF) diluted for example to 1%. It can also be carried out using a solution of phosphoric acid (H3PO4). For example, to remove 10 nm of modified silicon nitride, an HF solution at 1% for 30 seconds or an H3PO4 solution for the same time can be used.

As indicated in the detailed description, the removal of the modified layer 158 can also be carried out using a plasma called remote plasma. The thickness of the modified layer to be removed is also typically between 1 and several tens of nanometers here. The implementation conditions comprise two steps:

In a first step, solid salts are generated from a chemistry based either on the use of fluorine and hydrogen and products such as nitrogen trifluoride (NF3) or ammonia (NH3) and a process similar to the process obtained with hydrofluoric acid (HF), or on the use of phosphine (PH3) combined with hydrogen and oxygen for a process similar to the phosphoric acid (H3PO4) process. The necessary times range from several seconds to several minutes, the temperature from 10° C. to 50° C., and the pressure from several mTorr to several Torr.

Then, the salts produced are sublimed at a temperature greater than 100° C. for several tens of seconds.

For example, to remove 10 nm of modified silicon nitride, nitrogen trifluoride (NF3) with a flow rate of 50 sccm and ammonia with a flow rate of 300 sccm at a temperature of 30° C. for 45 seconds can be used to produce the solid species that are then sublimed at a temperature of 180° C. for 60 seconds.

The preceding description discloses numerous advantages conferred by the invention. The method of the invention in particular allows anisotropic modification carried out in a manner that is highly selective with respect to the carbon, the non-modified portions of the protective layer that form the spacers for the gate, and a semiconductor material such as silicon.

The carbon film 271 formed during the modification step of the method resists the bombardment of the ions of the plasma, which allows the protective layer 158 to be protected during the modification step and during the step 470 of removal. Moreover, the protective film 190 allows the carbon film 271 and the spacers to be protected during the step 460 of removal of the layer 311 comprising carbon.

The spacers of a first type of transistor 200 can thus be formed accurately, without the disadvantages of the prior art, while preserving the structures 300 protected by a masking block formed by a layer 311 comprising carbon.

The method of the invention is particularly advantageous for forming the spacers of MOSFET or FinFET transistors.

The invention is not limited to the embodiments and examples described above, but extends to all the embodiments that fall within the scope of the claims.

The invention claimed is:

1. A method for forming spacers of a gate of a field-effect transistor, the gate comprising a top and sides and being located above an active layer made of a semiconductor material, the method comprising:
   at least one step of forming a protective layer covering the gate, the protective layer being a layer containing nitrogen and/or containing silicon and/or containing carbon that has a dielectric constant less than or equal to 8;
   depositing a layer comprising carbon, said layer being disposed distant from said transistor;
   at least one step of modifying the protective layer by placing the protective layer in the presence of a plasma into which $C_xH_y$ is introduced, where x is the proportion of carbon and y is the proportion of hydrogen, and comprising ions heavier than hydrogen;
   choosing conditions of the plasma, including a concentration of $C_xH_y$, energy of ions of the plasma, and a main implantation direction, such that:
      the plasma creates a bombardment by ions made from hydrogen coming from the $C_xH_y$, the bombardment being anisotropic in the main implantation direction that is parallel to the sides of the gate, so as to form a modified protective layer by modifying portions of the protective layer located on the top of the gate and on at least one side of the sides of the gate and so as to preserve non-modified portions of the protective layer covering the sides of the gate,
      chemical species of the plasma containing carbon coming from the $C_xH_y$, form a carbon film at least on the sides of the gate, and
      the plasma creates a bombardment by ions heavier than hydrogen that prevents said chemical species of the plasma containing carbon and coming from the $C_xH_y$ from forming the carbon film at least on surfaces of the protective layer that are perpendicular to the main implantation direction;
   at least one step of forming a protective film on at least the layer comprising carbon, as well as on the modified protective layer and on the carbon film covering said at least the sides of the gate;
   removing the protective film on surfaces of the protective film that are perpendicular to the main implantation direction and so as to preserve the protective film on surfaces of the protective film that are parallel to the main implantation direction;
   removing the layer comprising carbon selectively with respect to the modified protective layer and the protective film; and
   removing the modified protective layer by selective etching of the modified protective layer with respect to non-modified portions of the protective layer.

2. The method according to claim 1, wherein the layer comprising carbon is a layer of photosensitive resin, or a layer of heat-sensitive resin, or a hard mask comprising carbon.

3. The method according to claim 1,
wherein the layer comprising carbon is configured to cover a structure distinct from said transistor, and
wherein said transistor is an NMOS transistor and said structure is a PMOS transistor, or said transistor is a PMOS transistor and said structure is an NMOS transistor.

4. The method according to claim 1, wherein the at least one step of modifying the protective layer and the at least one step of forming the protective film are performed in the same plasma reactor.

5. The method according to claim 1, wherein the removing of the protective film comprises etching so as to remove the protective film on the top of the gate and on at least one top of the layer comprising carbon and so as to preserve the protective film on the sides of the gate.

6. The method according to claim 5, wherein the removing of the protective film further comprises plasma etching performed in the same reactor as for said at least one step of modifying the protective layer.

7. The method according to claim 1,
wherein the protective film located on the sides of the gate is removed during the step of removing the modified protective layer, and
wherein the protective film is an oxide and/or a nitride.

8. The method according to claim 1, wherein the protective layer has a dielectric constant less than 6.

9. The method according to claim 1, wherein the protective layer is a layer containing silicon nitride.

10. The method according to claim 1, wherein a material of the protective layer chosen from among SiCO, SiC, SiCN, SiOCN, SiCBN, SiOCH, CBN, BN, and $SiO_2$.

11. The method according to claim 1, wherein the protective layer is a porous layer.

12. The method according to claim 1, wherein the protective layer is a nonporous layer.

13. The method according to claim 1,
wherein the at least one step of forming the protective layer comprises a step of depositing the protective layer during which a step of reducing the dielectric constant of the protective layer is performed, and
wherein the step of reducing the dielectric constant of the protective layer includes introducing porosity into the protective layer and/or wherein the at least one step of forming the protective layer comprises introducing precursors into the protective layer being deposited.

14. The method according to claim 1, wherein during the at least one step of modifying the protective layer, a concentration of $C_xH_y$ in the plasma is between about 2% and about 50%.

15. The method according to claim 1, wherein during the at least one step of modifying the protective layer, a concentration of ions heavier than hydrogen in the plasma is between about 50% and about 98%.

16. The method according to claim 1, wherein the ions heavier than hydrogen are chosen from among argon, helium, nitrogen, xenon, and oxygen.

17. The method according to claim 1, wherein the at least one step of modifying is performed such that the plasma generates the bombardment by the ions heavier than hydrogen in an anisotropic manner in the main implantation direction parallel to the sides of the gate so as to prevent said chemical species of the plasma containing carbon coming from the $C_xH_y$ from forming a carbon film on surfaces perpendicular to the sides of the gate.

18. The method according to claim 1, wherein the at least one step of modifying is performed such that the ions heavier than hydrogen of the plasma dissociate molecules of the $C_xH_y$ and allow hydrogen ions coming from the $C_xH_y$ to form ions made from hydrogen to be implanted in the modified portions of the protective layer.

19. The method according to claim 1, wherein the at least one step of modifying is performed so as to modify only an upper portion of a thickness of the protective layer on the sides of the gate while preserving a nonmodified thickness of the protective layer on the sides of the gate.

20. The method according to claim 1, wherein the at least one step of modifying is performed such that the plasma modifies the protective layer continuously from the surfaces of the protective layer and over a thickness between about 1 nm and about 30 nm.

* * * * *